United States Patent
Noguchi et al.

(10) Patent No.: US 9,006,725 B2
(45) Date of Patent: Apr. 14, 2015

(54) DITHIENOPHTHALIMIDE SEMICONDUCTOR POLYMERS

(75) Inventors: Hiroyoshi Noguchi, Singapore (SG); Florian Doetz, Mannheim (DE); Ashok Kumar Mishra, Singapore (SG); Subramanian Vaidyanathan, Basel (CH); Mai Minh-Tien, Singapore (SG)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/129,772

(22) PCT Filed: Jul. 4, 2012

(86) PCT No.: PCT/EP2012/062996
§ 371 (c)(1),
(2), (4) Date: Dec. 27, 2013

(87) PCT Pub. No.: WO2013/004730
PCT Pub. Date: Jan. 10, 2013

(65) Prior Publication Data
US 2014/0142265 A1     May 22, 2014

Related U.S. Application Data

(60) Provisional application No. 61/504,346, filed on Jul. 5, 2011.

(51) Int. Cl.
*H01L 29/08* (2006.01)
*H01L 51/00* (2006.01)
*C08G 61/12* (2006.01)
*H01L 51/05* (2006.01)

(52) U.S. Cl.
CPC ........ *H01L 51/0036* (2013.01); *H01L 51/0043* (2013.01); *H01L 51/0558* (2013.01); *Y02E10/549* (2013.01); *C08G 61/126* (2013.01); *C08G 2261/124* (2013.01); *C08G 2261/1412* (2013.01); *C08G 2261/3223* (2013.01); *C08G 2261/3327* (2013.01); *C08G 2261/344* (2013.01); *C08G 2261/364* (2013.01); *C08G 2261/92* (2013.01)

(58) Field of Classification Search
USPC ............... 528/360, 367; 257/40, E51.005, 257/E51.024
See application file for complete search history.

(56) References Cited

U.S. PATENT DOCUMENTS

| 8,466,460 | B2 * | 6/2013 | Mishra et al. ............ 257/40 |
| 2010/0283047 | A1 | 11/2010 | Facchetti et al. |
| 2010/0326527 | A1 | 12/2010 | Facchetti et al. |
| 2011/0120558 | A1 | 5/2011 | Facchetti et al. |
| 2011/0213117 | A1 | 9/2011 | Facchetti |
| 2012/0153274 | A1 * | 6/2012 | Sonar et al. ............ 257/40 |

FOREIGN PATENT DOCUMENTS

| WO | WO 2009/098250 A1 | 8/2009 |
| WO | WO 2010/052287 A1 | 5/2010 |

OTHER PUBLICATIONS

International Preliminary Report on Patentability and Written Opinion issued Jan. 7, 2014 in PCT/EP2012/062996.
International Search Report issued Dec. 4, 2012 in PCT/EP2012/062996.
Xugang Guo, et al., "Bithiophene-Imide-Based Polymeric Semiconductors for Field-Effect Transistors: Synthesis, Structure-Property Correlations, Charge Carrier Polarity, and Device Stability" Journal of the American Chemical Society, vol. 133, No. 5, XP055045743, Feb. 9, 2011, pp. 1405-1418.
Joseph A. Letizia, et al., "n-Channel Polymers by Design: Optimizing the Interplay of Solubilizing Substituents, Crystal Packing, and Field-Effect Transistor Characteristics in Polymeric Bithiophene Imide Semiconductors" Journal of the American Chemical Society, vol. 130, No. 30, XP002585890, Jul. 30, 2008, pp. 9679-9694.
Haifeng Wang, et al., "Conjugated Polymers Based on a New Building Block: Dithienophthalimide" Macromolecules, vol. 44, No. 11, XP055030805, Jun. 14, 2011, pp. 4213-4221.
Xin Guo, et al., "Benzotrithiophene-Based Donor-Acceptor Copolymers with Distinct Supramolecular Organizations" Journal of the American Chemical Society, vol. 134, No. 20, XP055030778, May 23, 2012, pp. 8404-8407.

Gaole Dai, et al., "Dithieno-naphthalimide based copolymers for air-stable field effect transistors: synthesis, characterization and device performance" Journal of Materials Chemistry, vol. 22, No. 39, XP055045738, Jan. 1, 2012, pp. 21201-21209.

Ming Zhang, et al., "Field-Effect Transistors Based on a Benzothiadiazole-Cyclopentadithiophene Copolymer" Journal of the American Chemical Society, vol. 129, 2007, pp. 3472-3473.

Junying Liu, et al., "Highly Disordered Polymer Field Effect Transistors: N-Alkyl Dithieno[3,2-b:2',3'-d]pyrrole-Based Copolymers with Surprisingly High Charge Carrier Mobilities" Journal of the American Chemical Society, vol. 130, 2008, pp. 13167-13176.

Ralph Rieger, et al., "Rational Optimization of Benzo[2,1-b;3,4-b']dithiophene-Containing Polymers for Organic Field-Effect Transistors" Advanced Materials, vol. 22, 2010, pp. 83-86.

Shengqiang Xiao, et al., "Conjugated Polymers of Fused Bithiophenes with Enhanced π-Electron Delocalization for Photovoltaic Applications" Macromolecules, vol. 41, 2008, pp. 5688-5696.

\* cited by examiner

*Primary Examiner* — Shane Fang

(74) *Attorney, Agent, or Firm* — Oblon, McClelland, Maier & Neustadt, L.L.P.

(57) ABSTRACT

The invention concerns a polymer of the formula (I): wherein: M1 is an optionally substituted dithienophthalimide formula (II): wherein: X is N or C—R, wherein R is H or a $C_1$-$C_{40}$ alkyl group, $R^2$, at each occurrence, is independently selected from H, a $C_{1-40}$ alkyl group, a $C_{2-40}$ alkenyl group, a $C_{1-40}$ haloalkyl group, and a monocyclic or polycyclic moiety, wherein: each of the $C_{1-40}$ alkyl group, the $C_{2-40}$ alkenyl group, and the $C_{1-40}$ haloalkyl group can be optionally substituted with 1-10 substituents independently selected from a halogen, CN, —$NO_2$, OH, $NH_2$, —NH($C_{1-20}$ alkyl), N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$; and the monocyclic or polycyclic moiety can be covalently bonded to the imide nitrogen via an optional linker, and can be optionally substituted with 1-5 substituents independently selected from a halogen, oxo, —CN, —$NO_2$, OH, =C(CN)$_2$, —$NH_2$, —NH($C_{1-20}$ alkyl), N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20\ alkyl}$)$_2$, —$SiH_3$, —SiH($C_{1-20}$ alkyl)$_2$, —$SiH_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, $C_{1-20}$ alkyl, $C_{1-20}$ alkenyl, $C_{1-20}$ haloalkyl, $C_{7-20}$ arylalkyl, $C_{6-20}$ aryloxy and $C_{7-20}$ arylcarbonyl. $M_2$ is a repeating unit comprising one or more cyclic moieties; and n is an integer between 2 and 5,000.

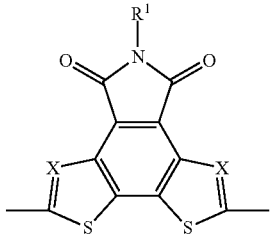

8 Claims, 1 Drawing Sheet

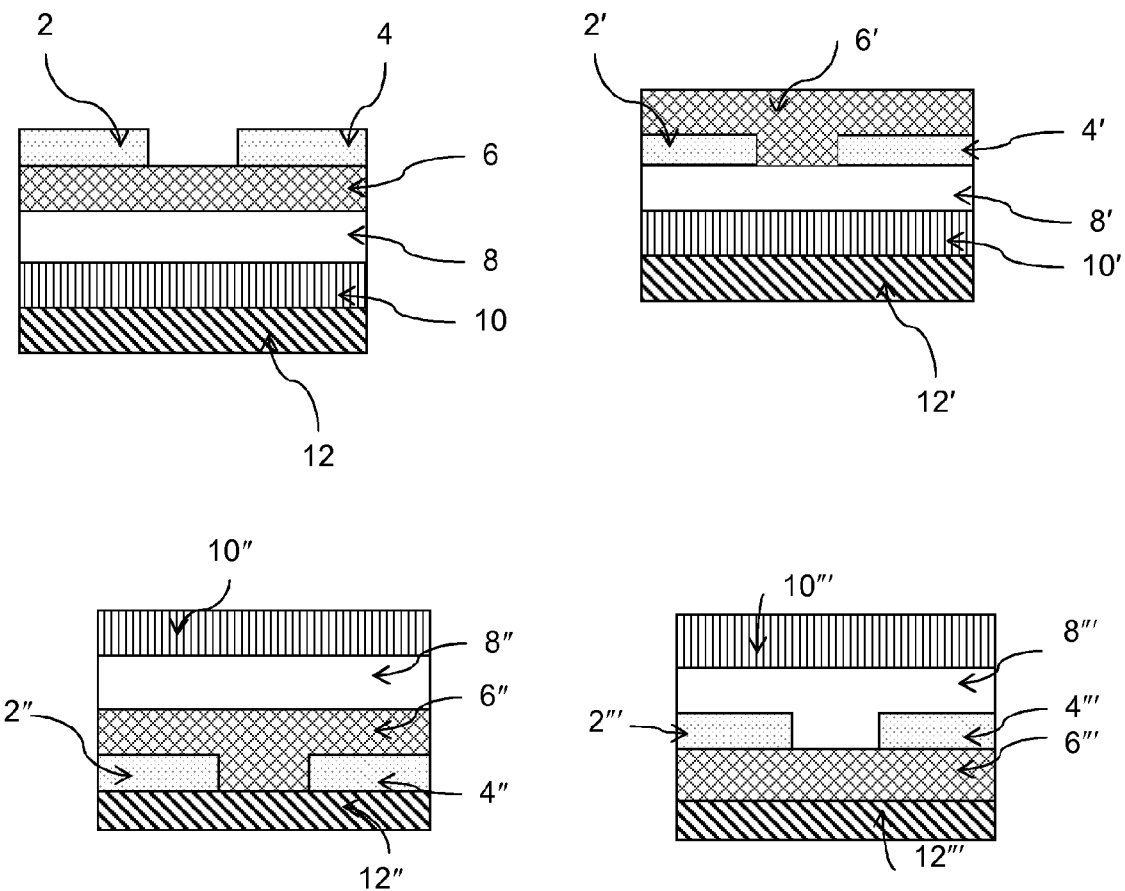

DITHIENOPHTHALIMIDE SEMICONDUCTOR POLYMERS

The present invention relates to dithienophthalimide semiconductor polymers as well as articles of manufacture comprising one or more of the polymers.

A new generation of optoelectronic devices such as organic thin film transistors (OTFTs), organic light emitting transistors (OLETs), organic light emitting diodes (OLEDs), printable circuits, organic photovoltaic (OPV) devices, electrochemical capacitors, and sensors are built upon organic semiconductors as their active components. To enable high device efficiencies such as large charge carrier mobilities (μ) needed for transistor/circuit operations, or efficient exciton formation/splitting that is necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner.

Several p- and n-channel molecular semiconductors have achieved acceptable device performance and stability. For example, OTFTs based on certain acenes, oligothiophenes (p-channel), and perylenes (n-channel) can exhibit carrier mobilities (μ's) greater than about 0.5 $cm^2/Vs$ in ambient conditions. However, molecular semiconductors typically are less easily processable than polymeric semiconductors, and often cannot be processed via printing methodologies due to solution viscosity requirements.

Zhang, M.; Tsao, H. N.; Pisula, W.; Yang, C.; Mishra, A. K.; Müllen, K. *J. Am. Chem. Soc.* 2007, 129, 3472-3473 describe a polymer of formula

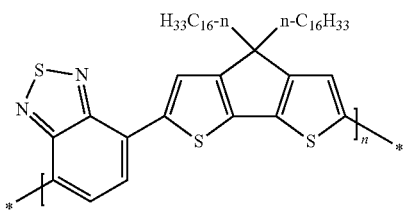

for use in organic field effect transistors (OFETs).

Junying Liu, Rui Zhang, Geneviève Sauvé, Tomasz Kowalewski, and Richard D. McCullough, *J. Am. Chem. Soc.* 2008, 130, 13167-13176 describe the polymers

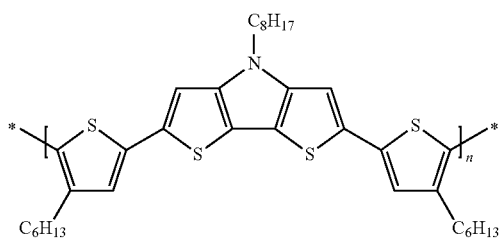

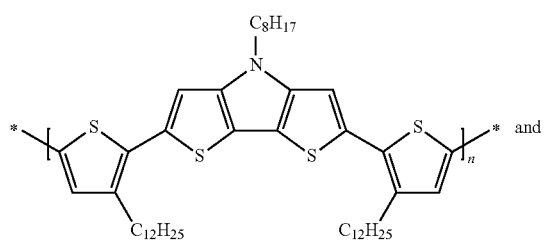

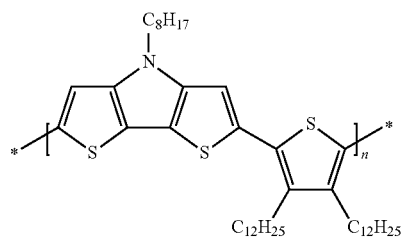

for use in organic field-effect transistors (OFETs).

Rieger, R.; Beckmann, D.; Pisula, W.; Steffen, W.; Kastler, M.; Müllen K. *Adv. Mater.* 2010, 22, 83-86 describe the polymers

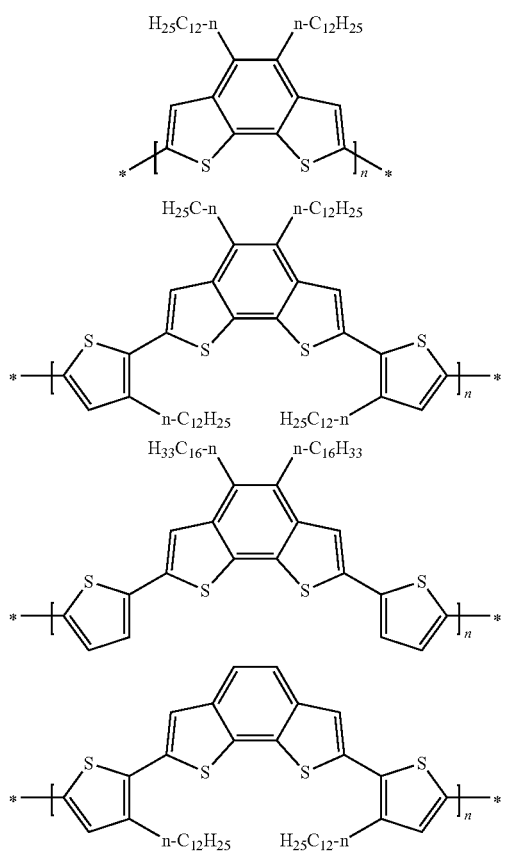

for use in organic field-effect transistors (OFETs).

Xiao, S; Zhou H.; You, W. *Macromolecules* 2008, 41, 5688-5696 describes the following polymers:

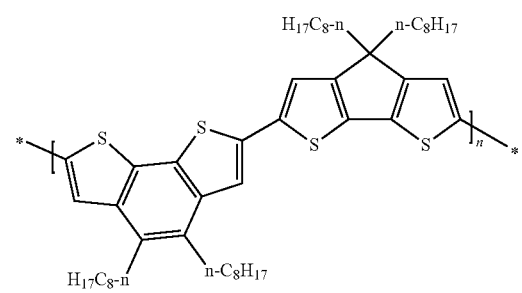

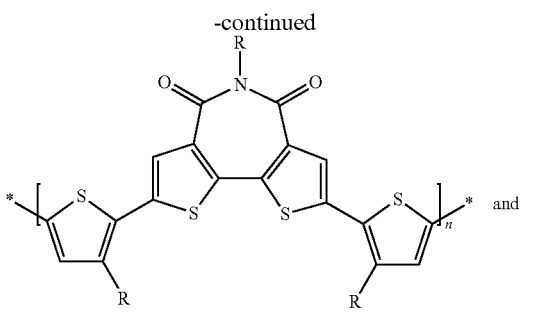

R = n-decyl or n-dodecyl

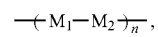

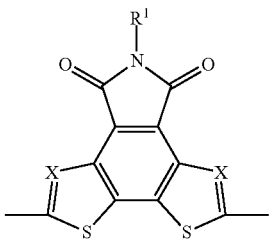

R = n-decyl or n-dodecyl for use in organic field-effect transistors (OFETs).

However, the art desires new polymeric semiconductors, particularly those having good stability, processing properties, and/or charge transport characteristics in ambient conditions.

In light of the foregoing, it is an object of the present invention to provide semiconducting polymers that can address various deficiencies and shortcomings of the prior art, including those outlined above. It is also an object of the present invention to provide devices and methods for the preparation and use of these polymers.

The object is solved by polymers that can be represented by the formula:

$$-\!\!-\!\!(\!M_1\!-\!M_2\!)_n\!-\!\!-,$$

wherein $M_1$ is an optionally substituted dithienophthalimide:

as donor materials for use in photovoltaic devices.

Xugang Guo, Rocio Ponce Ortiz, Yan Zheng,‡ Yan Hu, Yong-Young Noh, Kang-Jun Baeg, Antonio Facchetti, and Tobin J. Marks, *J. Am. Chem. Soc.* 2011, 133, 1405-1418 describe the polymers

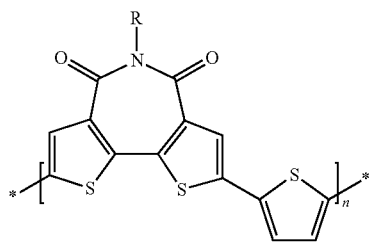

R = 1-octylnonyl wherein:

X is N or C—R, wherein R is H or a $C_{1-40}$ alkyl group, $R^1$, at each occurrence, is independently selected from H, a $C_{1-40}$ alkyl group, a $C_{2-40}$ alkenyl group, a $C_{1-40}$ haloalkyl group, and a monocyclic or polycyclic moiety, wherein:

each of the $C_{1-40}$ alkyl group, the $C_{2-40}$ alkenyl group, and the $C_{1-40}$ haloalkyl group can be optionally substituted with 1-10 substituents independently selected from halogen, —CN, —NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$alkyl, —SiH$_3$, —SiH(C$_{1-20}$ alkyl)$_2$, —SiH$_2$(C$_{1-20}$ alkyl), and —Si(C$_{1-20}$ alkyl)$_3$; and each of the monocyclic or polycyclic moiety can be covalently bonded to the imide nitrogen via an optional linker, and can be optionally substituted with 1-5 substituents independently selected from halogen, oxo, —CN, —NO$_2$, OH, =C(CN)$_2$, —NH$_2$, —NH(C$_{1-20}$ alkyl), —N(C$_{1-20}$ alkyl)$_2$, —S(O)$_2$OH, —CHO, —C(O)OH, —C(O)—C$_{1-20}$ alkyl, —C(O)—OC$_{1-20}$ alkyl, —C(O)NH$_2$, —C(O)NH—C$_{1-20}$ alkyl, —C(O)N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, —O—C$_{1-20}$ alkyl, —O—C$_{1-20}$ alkenyl, —O—C$_{1-20}$ haloalkyl, C$_{1-20}$ alkyl, C$_{1-20}$ alkenyl, C$_{1-20}$ haloalkyl, C$_{7-20}$ arylalkyl, C$_{6-20}$ aryloxy and C$_{7-20}$ arylcarbonyl, M$_2$ is a repeating unit comprising one or more cyclic moieties; and n is an integer between 2 and 5,000.

The present invention also provide methods of preparing such polymers and semiconductor materials, as well as various compositions, composites, and devices that incorporate the polymers and semiconductor materials disclosed herein.

The present polymers can exhibit properties such as excellent charge transport characteristics in ambient conditions, chemical stability, low-temperature processability, large solubility in common solvents, and processing versatility (e.g., printability). As a result, field effect devices such as thin film transistors that incorporate one or more of the present polymers as the semiconductor layer can exhibit high performance in ambient conditions, for example, demonstrating one or more of large charge carrier (hole) mobilities, low threshold voltages, and high current on-off ratios. Similarly, other organic semiconductor-based devices such as OPVs, OLETs, and OLEDs can be fabricated efficiently using the polymeric materials described herein.

Polymers of the present invention can exhibit semiconductor behavior such as high charge carrier mobility and/or good current modulation characteristics in a field-effect device, light absorption/charge separation in a photovoltaic device, and/or charge transport/recombination/light emission in a light-emitting device. In addition, the present polymers can possess certain processing advantages such as solution-processability and/or good stability (for example, air stability) in ambient conditions. The polymers of the present invention can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Accordingly, one aspect of the present invention provides polymers having semiconducting activity and semiconductor materials prepared from these polymers. More specifically, the polymers can be A-B copolymers comprising a first repeating unit (monomer A, M$_1$) that includes a dithienophthalimide, and a second repeating unit (monomer B, M$_2$) that includes one or more cyclic moieties.

More specifically, monomer M$_1$ of the present polymers generally comprises an optionally substituted dithienophthalimide, while monomer M$_2$ generally comprises one or more optionally substituted aromatic or otherwise π-conjugated monocyclic moieties. In certain embodiments, monomer M$_2$ can include one or more linkers and/or one or more π-conjugated polycyclic moieties in addition to the one or more monocyclic moieties. In various embodiments, monomer M$_2$ as a whole is a π-conjugated polycyclic moiety.

In preferred embodiments, the polymers of the present invention include a comonomer M$_2$ having a formula selected from:

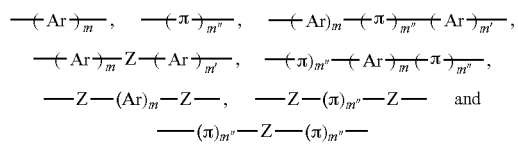

wherein:

π is an optionally substituted polycyclic aromatic or heteroaromatic moiety having from 8 to 24 ring atoms;

Ar, at each occurrence, is independently an optionally substituted monocyclic aryl or heteroaryl group having from 5 to 8 ring atoms;

Z is a conjugated linear linker; and m, m' independently are 0, 1, 2, 3, 4, 5 or 6, m" is 0, 1, 2 or 3.

As used herein, a "cyclic moiety" can include one or more (e.g., 1-6) carbocyclic or heterocyclic rings. The cyclic moiety can be a an aryl group, or a heteroaryl group, each including, for example, 5-24 ring atoms and can be optionally substituted as described herein. In embodiments where the cyclic moiety is a "monocyclic moiety," the "monocyclic moiety" can include a 5-14 membered aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) or one or more bridged atoms. A polycyclic moiety can include an 8-24 membered aromatic, carbocyclic or heterocyclic ring, such as a 8-24 membered aryl or heteroaryl group, each of which can be optionally substituted as described herein. The cyclic moiety can be a monocyclic or polycyclic cycloalkyl or cycloheteroalkyl group.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In general, an alkyl group has 1 to 40 carbon atoms, for example, 1-20 carbon atoms. In some embodiments, an alkyl group has 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. In general, a haloalkyl group has 1 to 40 carbon atoms, for example, 1 to 20 carbon atoms. Examples of haloalkyl groups include —CF$_3$, —C$_2$F$_5$, —CHF$_2$, —CH$_2$F, —CCl$_3$, —CHCl$_2$, —CH$_2$Cl, —C$_2$Cl$_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_zH_{2z+1-t}X^0_t$, where $X^0$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as —S(O)$_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In general, an alkenyl group has 2 to 40 carbon atoms, for example, 2 to 20 carbon atoms. In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In general, an alkynyl group has 2 to 40 carbon atoms, for example, 2 to 20 carbon atoms. In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In general, a cycloalkyl group has 5 to 24 carbon atoms, for example, 5 to 20 carbon atoms. A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. In general, a cycloheteroalkyl group has 5 to 24 ring atoms, for example, 5 to 24 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like.

Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system, which can include multiple fused rings. A polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have 5 to 24 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

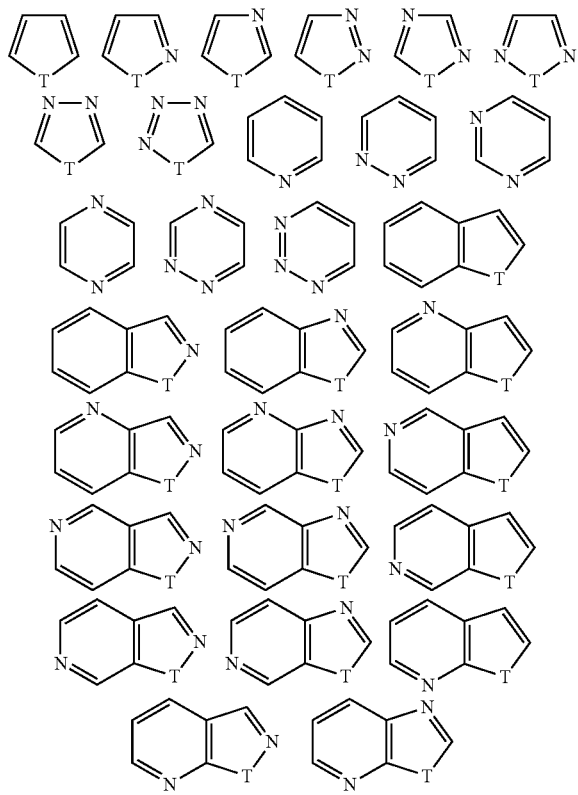

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "field effect mobility" refers to a measure of the velocity with which charge carriers, for example, holes (or units of positive charge) in the case of a p-type semiconductor material and electrons in the case of an n-type semiconductor material, move through the material under the influence of an electric field.

As used herein, a compound can be considered "ambient stable" or "stable at ambient conditions" when the charge carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

More specifically, in the formula of M$_1$

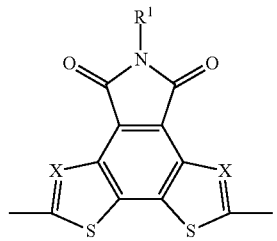

R$^1$, at each occurrence, is independently selected from H, a C$_{1-40}$ alkyl group, a C$_{2-40}$ alkenyl group, a C$_{1-40}$ haloalkyl group, and a monocyclic or polycyclic moiety having 5 to 24 ring atoms, wherein:

each of the $C_{1-40}$ alkyl group, the $C_{2-40}$ alkenyl group, and the $C_{1-40}$ haloalkyl group can be optionally substituted with 1-10 substituents independently selected from a halogen, —CN, —NO$_2$, OH, —NH$_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—OC$_{1-20}$alkyl, —C(O)NH$_2$, —C(O)NH—$C_{1-20}$ alkyl, —C(O)N($C_{1-20}$ alkyl)$_2$, —OC$_{1-20}$ alkyl, —SiH$_3$, —SiH($C_{1-20}$ alkyl)$_2$, —SiH$_2$($C_{1-20}$ alkyl), and —Si($C_{1-20}$ alkyl)$_3$;

the monocyclic or polycyclic moiety can be covalently bonded to the imide nitrogen via an optional linker, and can be optionally substituted with 1-5 substituents independently selected from a halogen, oxo, —CN, —NO$_2$, OH, =C(CN)$_2$, —NH$_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—OC$_{1-20}$ alkyl, —C(O)NH$_2$, —C(O)NH—$C_{1-20}$ alkyl, —C(O)N($C_{1-20}$ alkyl)$_2$, —SiH$_3$, —SiH($C_{1-20}$ alkyl)$_2$, —SiH$_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, —$C_{1-20}$ alkyl, —$C_{1-20}$ alkenyl, —$C_{1-20}$ haloalkyl, $C_{7-20}$ arylalkyl, $C_{6-20}$ aryloxy and $C_{7-20}$ arylcarbonyl.

In some embodiments, R$^1$ is selected from H, a $C_{1-40}$ alkyl group, a $C_{2-40}$ alkenyl group, a $C_{2-40}$ alkynyl group, a $C_{1-40}$ haloalkyl group, -L-Ar$^1$, -L-Ar$^1$—Ar$^1$, -L-Cy$^1$, -L-Cy$^1$-Cy$^1$, wherein:

L, at each occurrence, is independently selected from —Y—O—Y—, —Y—C(O)—Y—, —Y—, a divalent $C_{1-20}$ alkyl group, a divalent $C_{1-20}$ alkenyl group, a divalent $C_{1-20}$ haloalkyl group, and a covalent bond;

Ar$^1$, at each occurrence, is independently a monovalent or divalent $C_{6-14}$ aryl group or a 5-14 membered heteroaryl group, each optionally substituted with 1-5 substituents independently selected from a halogen, —CN, a $C_{1-6}$ alkyl group, a $C_{1-6}$ alkoxy group, and a $C_{1-6}$ haloalkyl group;

Cy$^1$, at each occurrence, is independently a monovalent or divalent $C_{5-14}$ cycloalkyl group or a 5-14 membered cycloheteroalkyl group, each optionally substituted with 1-5 substituents independently selected from a halogen, —CN, a $C_{1-6}$ alkyl group, a $C_{1-6}$ alkoxy group, and a $C_{1-6}$ haloalkyl group; and wherein:

Y, at each occurrence, is independently selected from a divalent $C_{1-6}$ alkyl group, a divalent $C_{1-6}$ haloalkyl group, and a covalent bond.

In some embodiments, substitution of alkyl chains (and similar groups such as haloalkyl groups, arylalkyl groups, heteroarylalkyl groups and so forth) on the imide nitrogen atom can improve solubility of the polymer in an organic solvent. Accordingly, in certain embodiments, R$^1$ can be a linear or branched $C_{3-40}$ alkyl group, examples of which include an n-hexyl group, a 1-methylpropyl group, a 1-methylbutyl group, a 1-methylpentyl group, a 1-methylhexyl group, a 1-ethylpropyl group, a 1-ethylbutyl group, a 1-3, dimethylbutyl group, and a 2-octyldodecyl group. In certain embodiments, R$^1$ can be a linear or branched $C_{3-40}$ alkenyl group. In particular embodiments, R$^1$ can be a branched $C_{3-20}$ alkyl group or a branched $C_{3-20}$ alkenyl group. For example, R$^1$, at each occurrence, independently can be selected from the following:

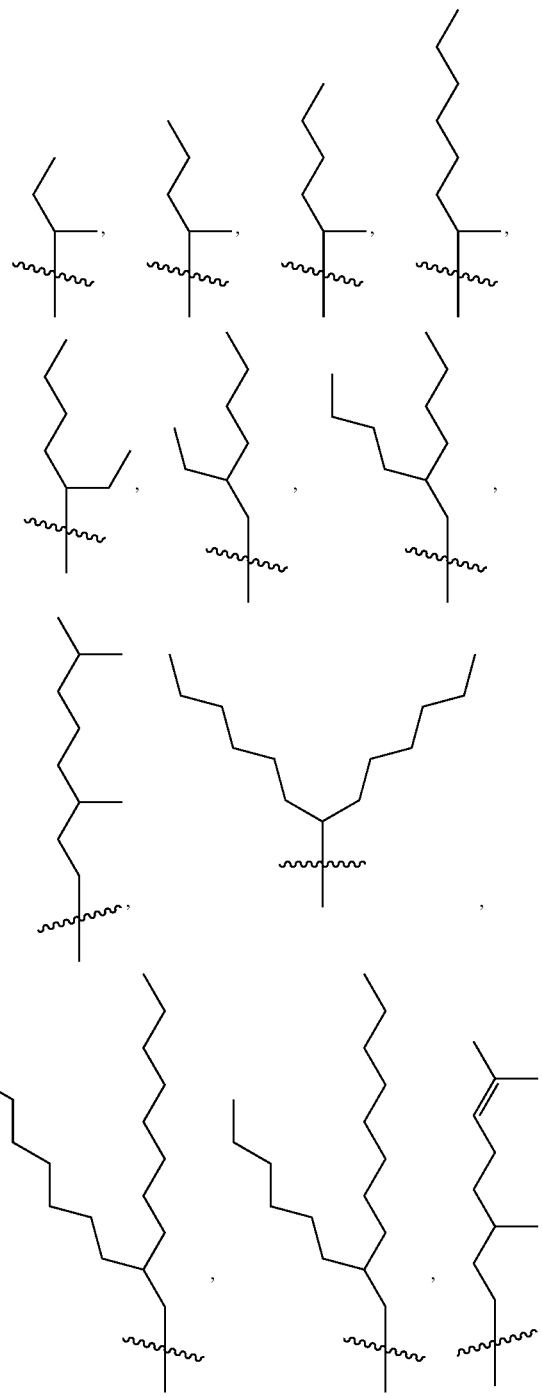

In certain embodiments, R$^1$, at each occurrence, can be a linear or branched $C_{6-40}$ alkyl or alkenyl group, an arylalkyl group optionally substituted with a linear or branched $C_{6-40}$ alkyl or alkenyl group, an aryl group (e.g., a phenyl group) substituted with a linear or branched $C_{6-40}$ alkyl or alkenyl group, or a biaryl group (e.g., a biphenyl group) optionally substituted with a linear or branched $C_{6-40}$ alkyl or alkenyl group, wherein each of these groups optionally can be substituted with 1-5 halo groups (e.g., F). In some embodiments, R$^1$ can be a biaryl group wherein the two aryl groups are covalently linked via a linker (L'). For example, the linker can be a divalent $C_{1-6}$ alkyl group or a carbonyl group. In particular embodiments, $R^1$, at each occurrence, independently can be selected from:

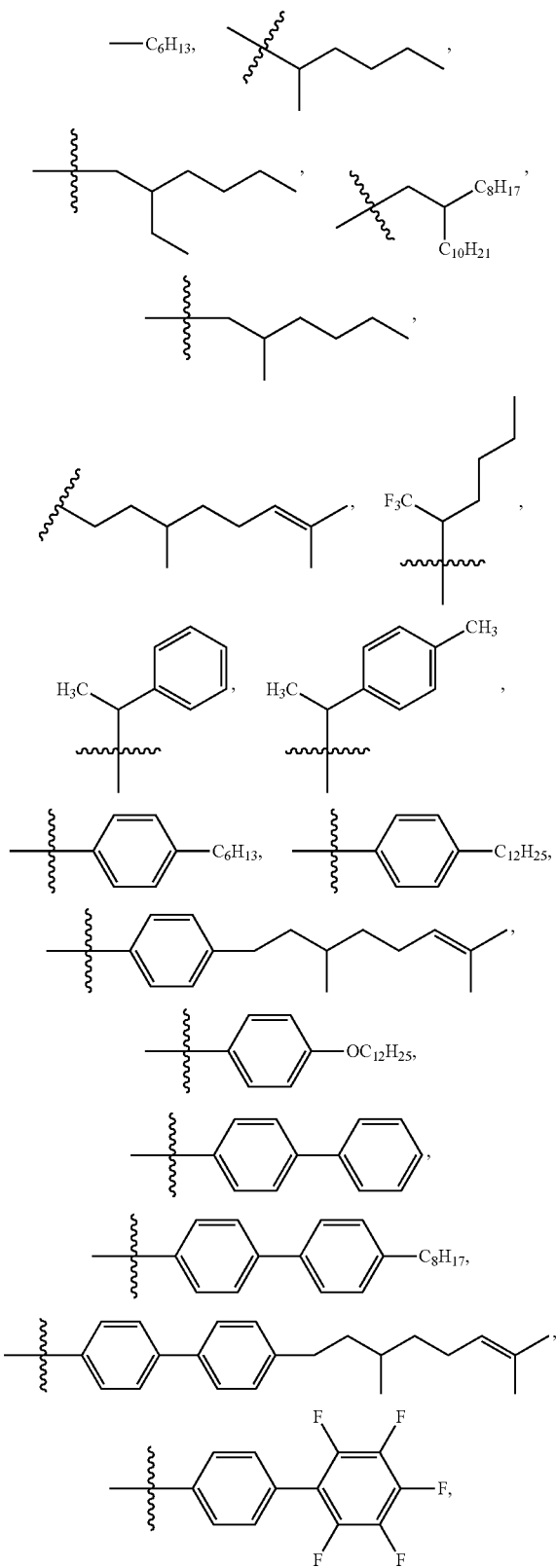

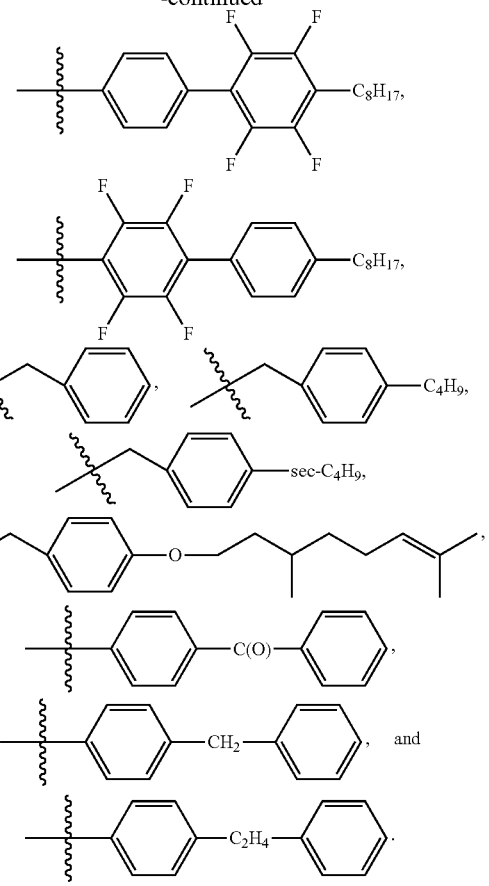

In some embodiments, $R^1$ can be an optionally substituted $C_{6-14}$ cycloalkyl group. For example, $R^1$, at each occurrence, independently can be selected from:

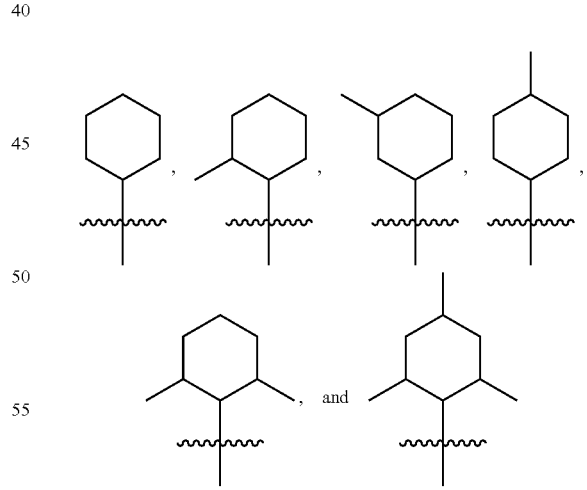

In preferred embodiments, the polymers of the present invention can include a comonomer $M_2$ having a formula selected from:

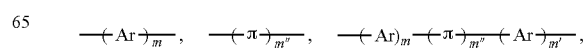

-continued

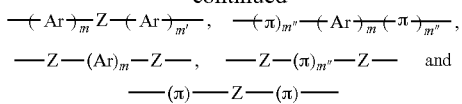

wherein:
Ar, at each occurrence, is independently an optionally substituted monocyclic aryl or heteroaryl group having from 5 to 8 ring atoms;
Z is a conjugated linear linker;
m, m' independently are 0, 1, 2, 3, 4, 5, or 6;
m" is 0, 1, 2, or 3;
π is a polycyclic 8-24 membered aryl group or a polycyclic 8-24 membered heteroaryl group, wherein each of these groups can be optionally substituted with 1-6 $R^e$ groups, wherein:
$R^e$, at each occurrence, is independently a) halogen, b) —CN, c) —NO$_2$, d) oxo, e) —OH, f) =C($R^f$)$_2$, g) a C$_{1-40}$ alkyl group, h) a C$_{2-40}$ alkenyl group, i) a C$_{2-40}$ alkynyl group, j) a C$_{1-40}$ alkoxy group, k) a C$_{1-40}$ alkylthio group, l) a C$_{1-40}$ haloalkyl group, m) a —Y—C$_{3-10}$ cycloalkyl group, n) a —Y—C$_{6-14}$ aryl group, o) a —Y—C$_{6-14}$ haloaryl group, p) a —Y-5-12 membered cycloheteroalkyl group, or q) a —Y-5-14 membered heteroaryl group, wherein each of the C$_{1-40}$ alkyl group, the C$_{2-40}$ alkenyl group, the C$_{2-40}$ alkynyl group, the C$_{5-10}$ cycloalkyl group, the C$_{6-14}$ aryl group, the C$_{6-14}$ haloaryl group, the 5-12 membered cycloheteroalkyl group, and the 5-14 membered heteroaryl group is optionally substituted with 1-4 $R^f$ groups;
$R^f$, at each occurrence, is independently a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$alkyl, m) —S(O)$_2$OH,
n) —S(O)$_w$—OC$_{1-20}$ alkyl, o) —S(O)$_w$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)—C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$aryl)$_2$, af) —C(S)N(C$_{1-20}$ alkyl)-C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$ (C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 5-12 membered cycloheteroalkyl group, or bb) a 5-14 membered heteroaryl group; and
w is 0, 1, or 2.

In general, π has a planar and highly conjugated cyclic core which can be optionally substituted as disclosed herein. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P.

π can include two or more (e.g., 2-4) fused rings where each ring can be a five-, six-, or seven-membered ring optionally substituted with 1-6 Re groups, wherein $R^e$ is as defined herein.

In some embodiments, π is selected from:

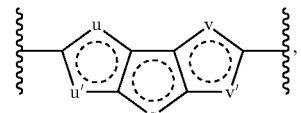

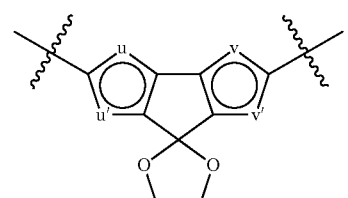

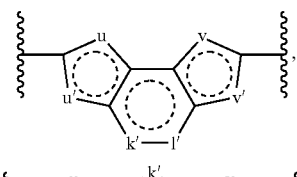

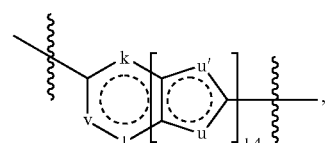

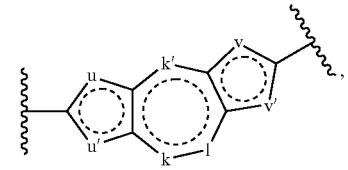

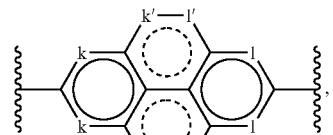

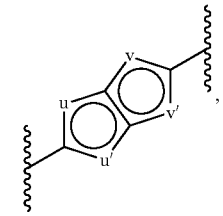

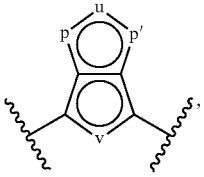

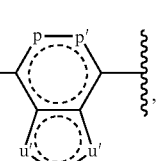

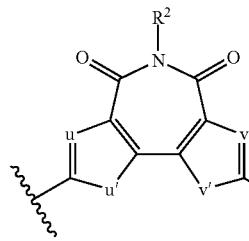

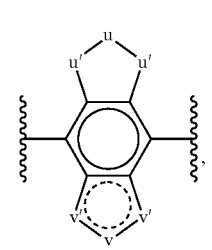

-continued

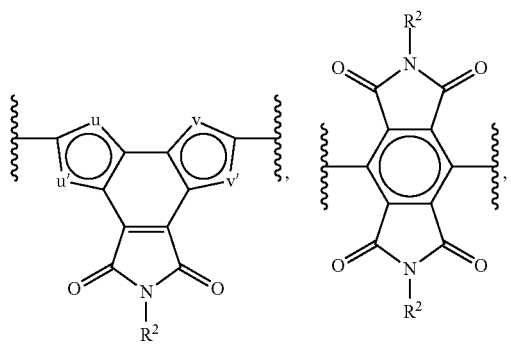
and

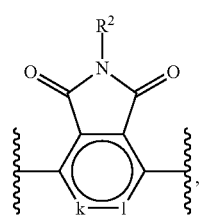

wherein:

k, k', l and l' independently are selected from —CR²═, ═CR²—, —C(O)—, and —C(C(CN)₂)—;

p, p', q and q' independently are selected from —CR²═, ═CR²—, —C(O)—, —C(C(CN)₂)—, —O—, —S—, —N═, ═N—, —N(R²)—, —SiR²═, ═SiR²—, and —SiR²R²—;

r and s independently are —CR²R²— or —C(C(CN)₂)13 ;

u, u', v and v' independently can be selected from —CR²═, ═CR²—, —C(O)—, —C(C(CN)₂)—, —S—, —S(O)—, —S(O)₂—, —O—, —N═, ═N—, —SiR²═, ═SiR²—, —SiR²R²—, CR²R²—CR²R²—, and —CR²═CR²—; and R², at each occurrence, independently is H or Rᵉ, wherein Rᵉ is as defined herein.

In certain embodiments, π is selected from:

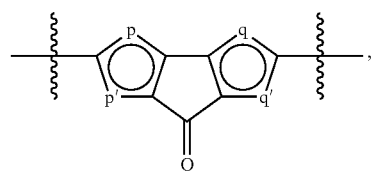

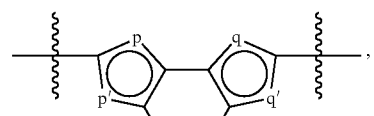

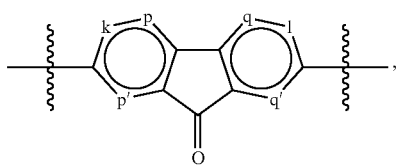

-continued

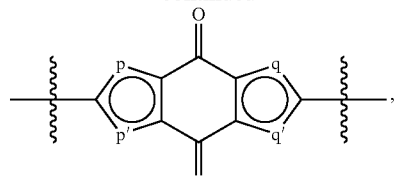

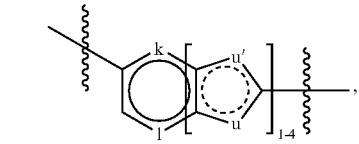

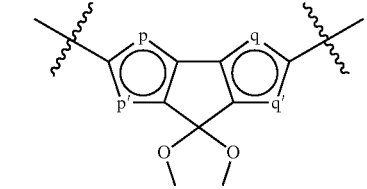

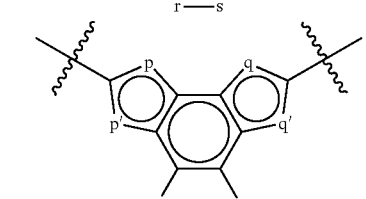

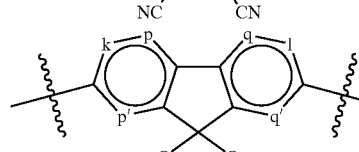

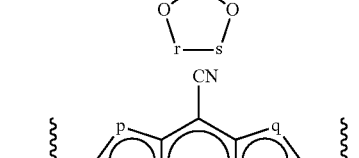

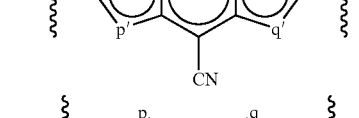

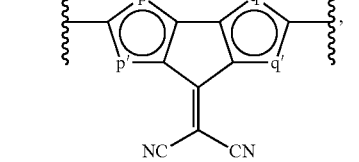

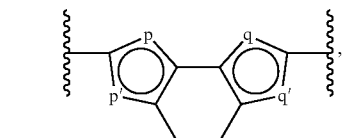

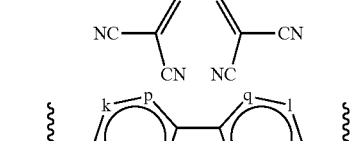

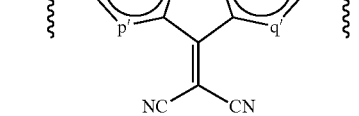

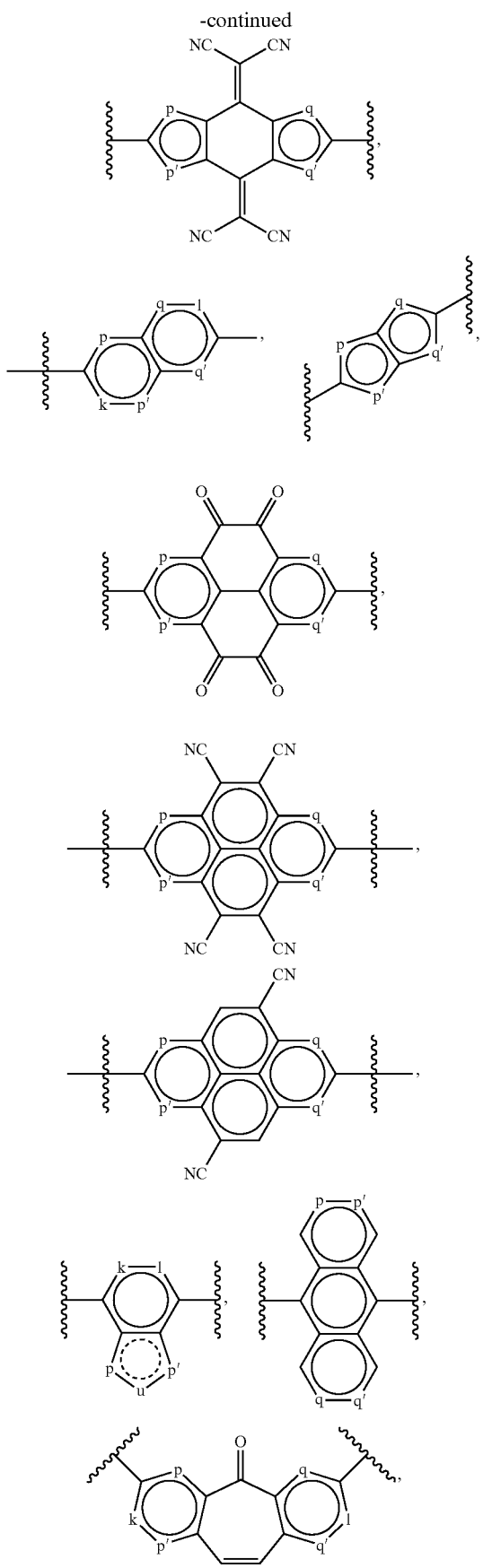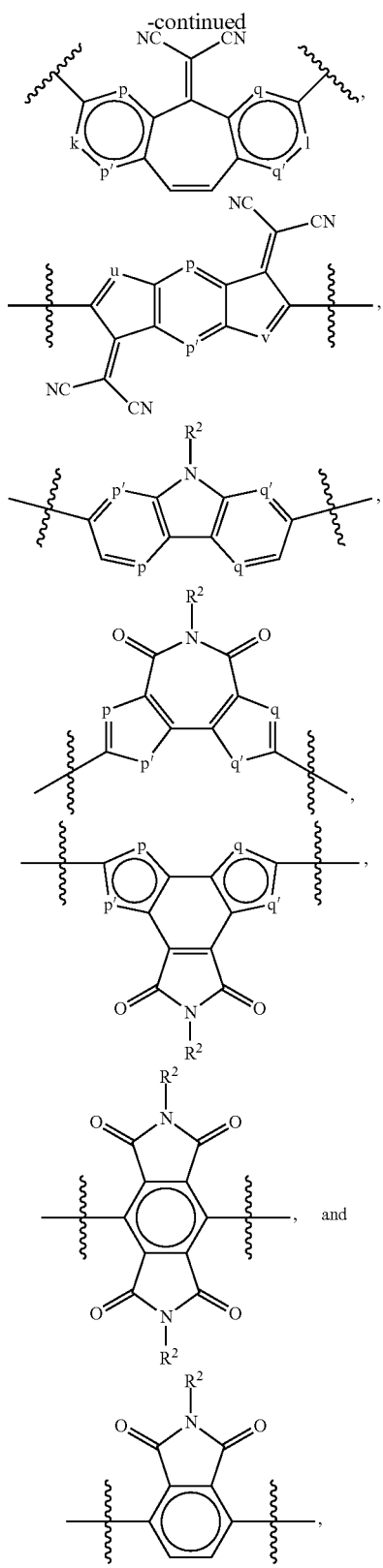
where k, l, p, p', q, q', r, s and $R^2$ are as defined herein. In some embodiments, k and l independently are selected from —$CR^2$=, =$CR^2$—, and —C(O)—; p, p', q, and q' independently are selected from —O—, —S—, —N($R^2$)—, —N=, =N—, —$CR^2$=, and =$CR^2$—; u and v independently are selected from —CR²=, =CR²—, —C(O)—, —C(C(CN)₂)—, —S—, —O—, —N=, =N—, —CR²R²—CR²R²—, and —CR²=CR²—; where R² is as defined herein. For example, R², at each occurrence, independently are selected from H, a halogen, —CN, a $C_{1-20}$ alkyl group, and a $C_{1-20}$ haloalkyl group. Each of r and s can be $CH_2$.

In certain embodiments, π can be a polycyclic moiety including one or more thienyl, thiazolyl, or phenyl groups, where each of these groups can be optionally substituted as disclosed herein. For example, π can be selected from:

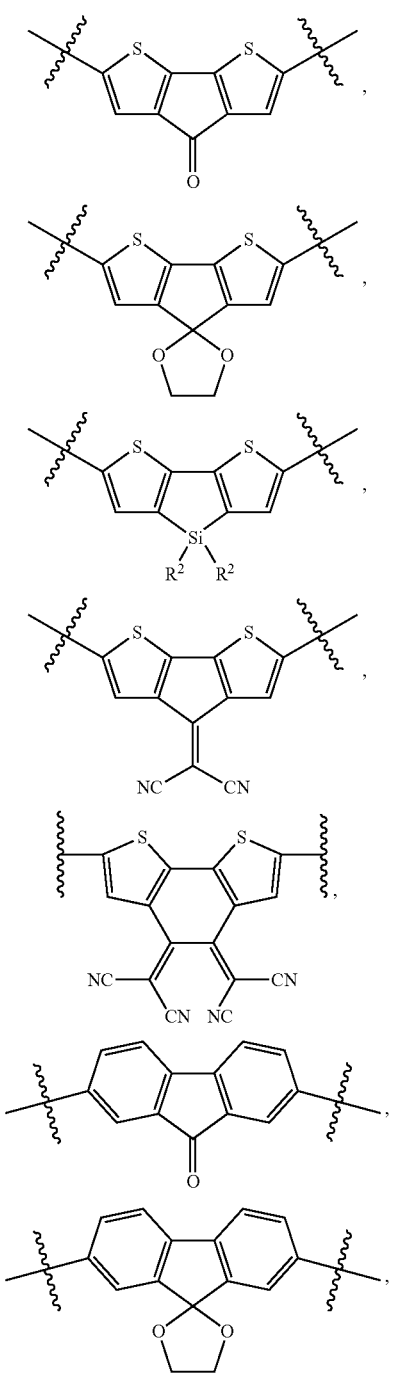

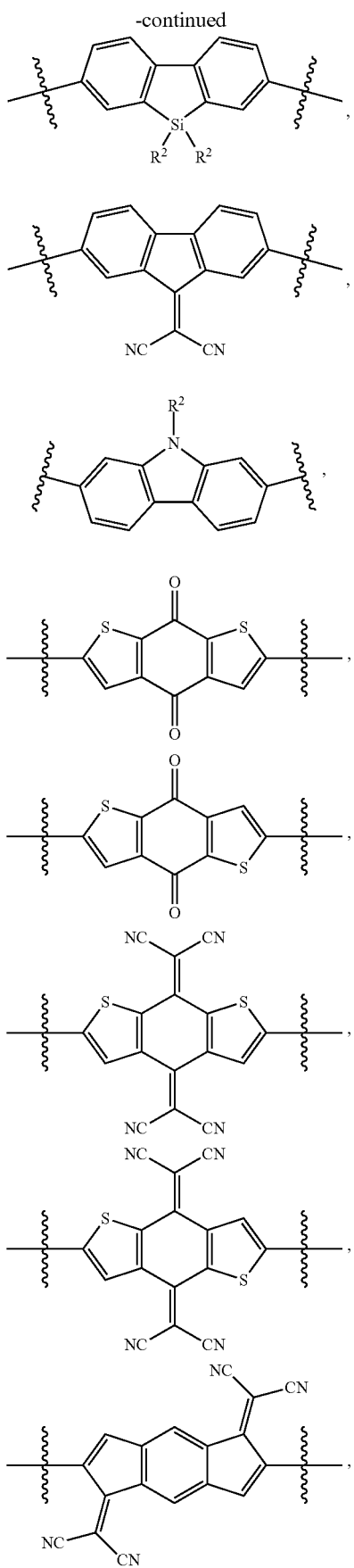

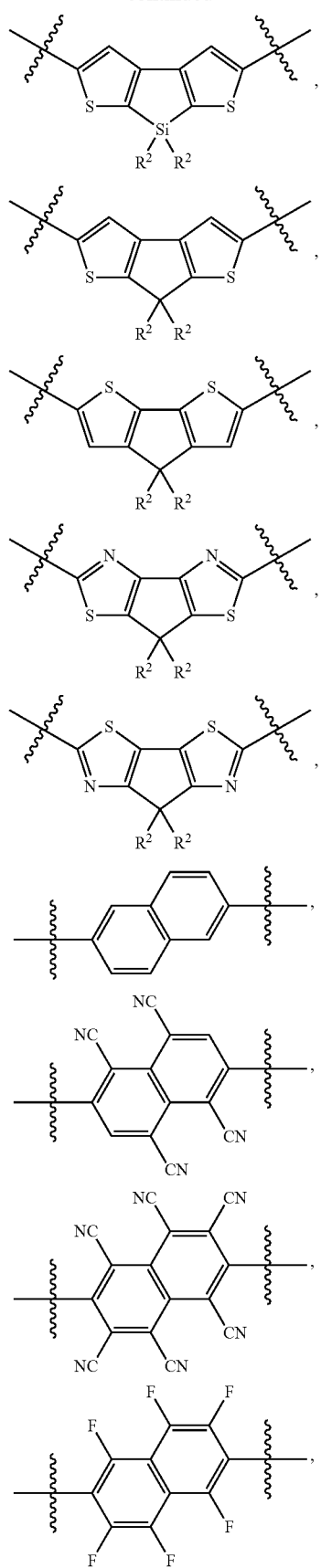
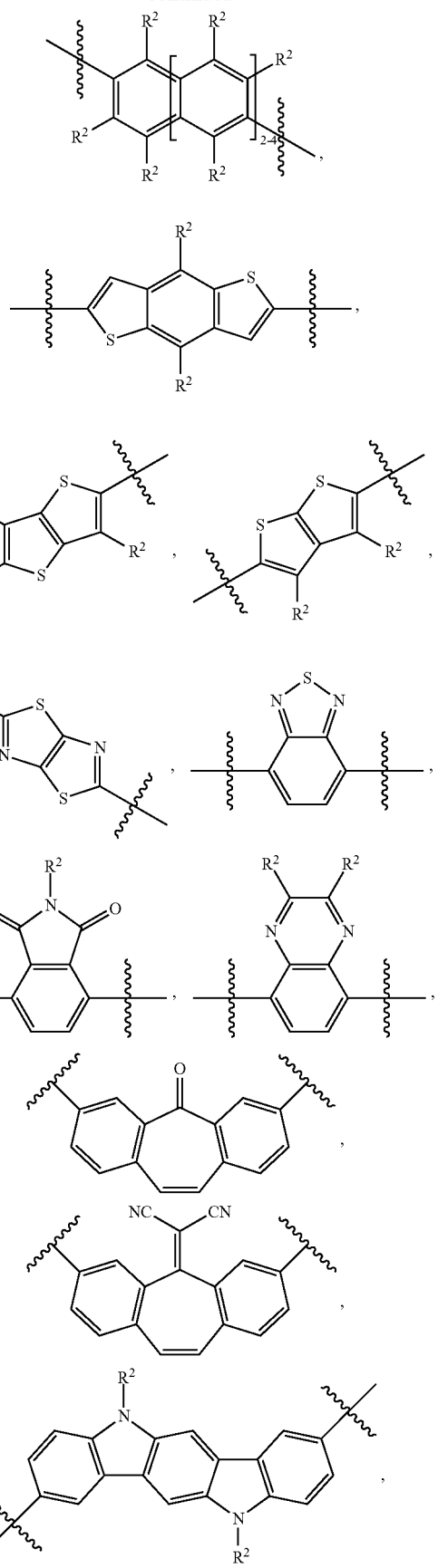

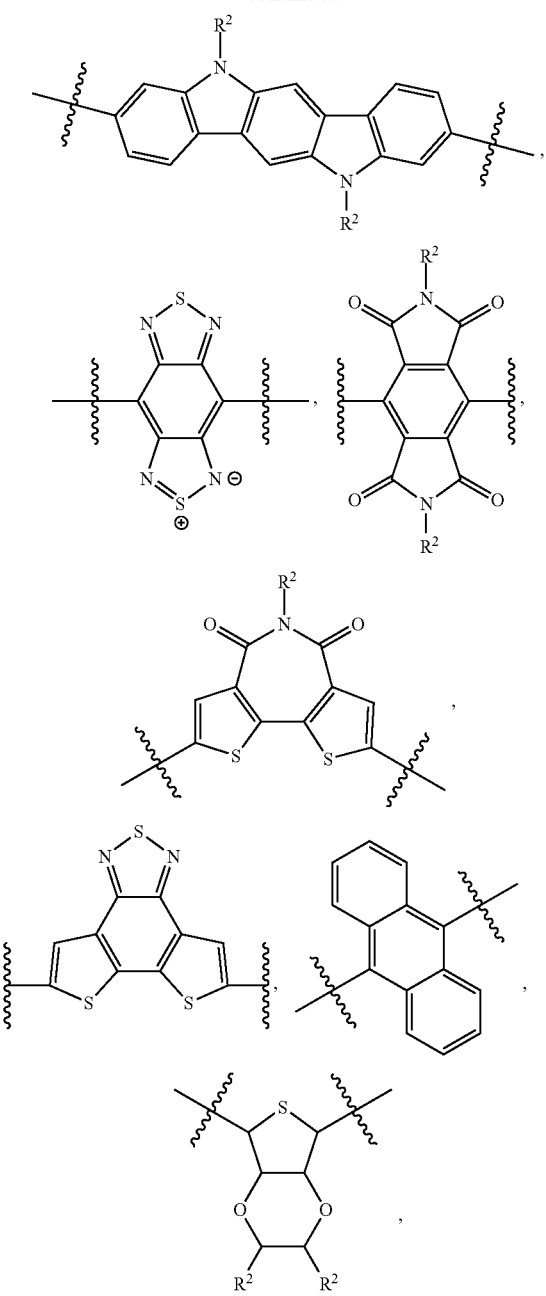
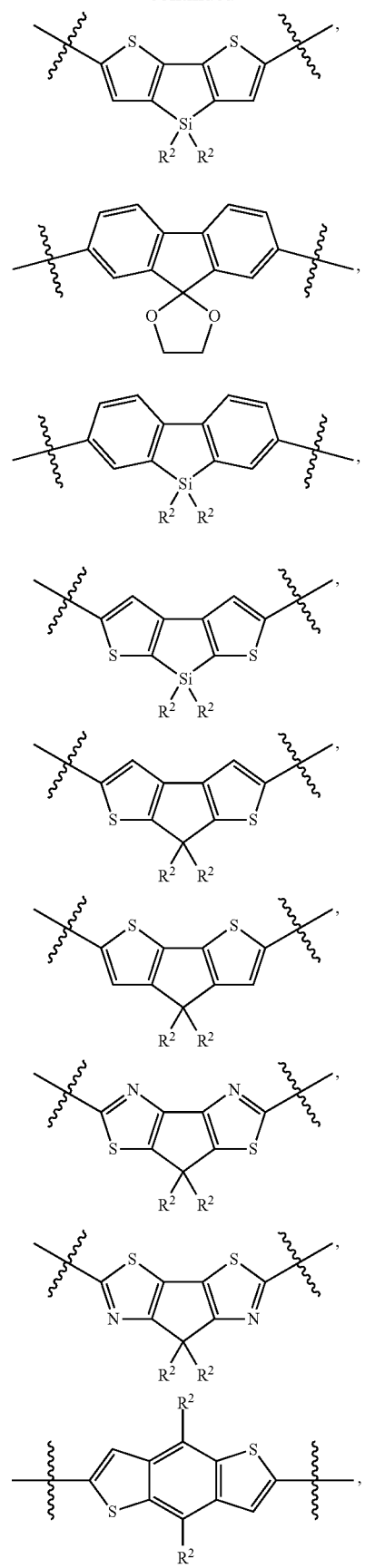
wherein $R^2$ is as defined herein. For example, $R^2$ can be selected from H, a $C_{1-20}$ alkyl group, a $C_{1-20}$ alkoxy group, and a $C_{1-20}$ haloalkyl group.
Preferred π are selected from
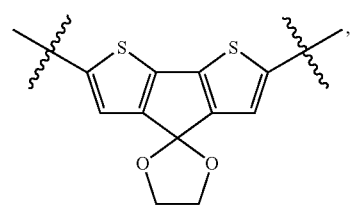

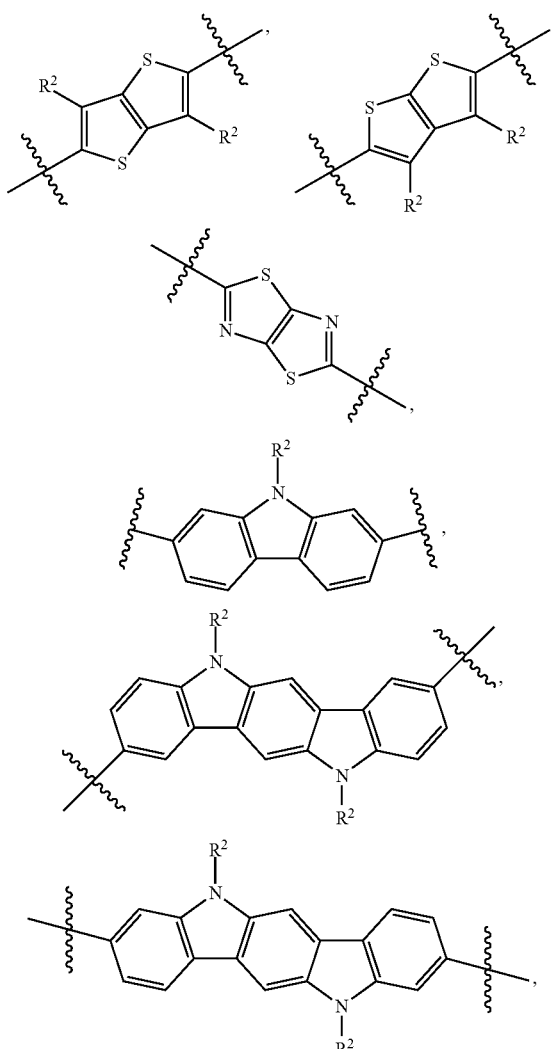

wherein R² is as defined herein.

Preferably, R² is selected from H, a $C_{1-20}$ alkyl group and a $C_{1-20}$ haloalkyl group.

Preferably, Ar is an optionally substituted phenylene group or 5- to 8-membered, in particular 5- or 6-membered heteroaromatic moiety.

In some embodiments, Ar, at each occurrence, independently is an optionally substituted monocyclic aromatic moiety selected from:

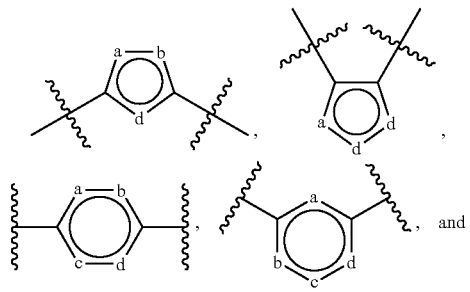

and wherein:
a, b, c and d independently are selected from —S—, —O—, —CH=, =CH—, —CR³=, =CR³—, —C(O)—, —C(C(CN)₂)—, —N=, =N—, 'NH— and —NR³—;

R³, at each occurrence, is independently selected from a) halogen, b) —CN, c) —NO₂, d) —N(R^c)₂, e) —OR^c, f) —C(O)R^c, g) —C(O)OR^c, h) —C(O)N(R^c)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{5-14}$ cycloalkyl group, p) a —Y—$C_{6-14}$ aryl group, q) a —Y-5-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, the 5-14 membered cycloheteroalkyl group, and the 5-14 membered heteroaryl group optionally is substituted with 1-5 $R^e$ groups; and Y, $R^c$ and $R^e$ are as defined herein.

Depending on whether it is located within the polymeric backbone or it constitutes one of the end groups of the polymer, Ar can be divalent or monovalent. Preferably, each Ar is independently a 5- or 6-membered aryl or heteroaryl group. More preferably, each Ar is selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 R³ groups, preferably 1-2 R³ groups, as defined herein. Preferred R³ groups are independently selected from a halogen, —CN, an oxo group, a $C_{1-20}$ alkyl group, a $C_{1-20}$ alkoxy group, a $C_{1-20}$ haloalkyl group, NH₂, NH($C_{1-6}$ alkyl) and N($C_{1-6}$ alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-20}$ alkyl group, a $C_{1-20}$ alkoxy group, a $C_{1-20}$ haloalkyl group, NH₂, NH($C_{1-6}$ alkyl) and N($C_{1-6}$ alkyl)₂. In some embodiments, Ar can be unsubstituted. In some embodiments, Ar is a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-20}$ alkyl groups.

By way of example, $(Ar)_m$ and $(Ar)_{m'}$ can be selected from:

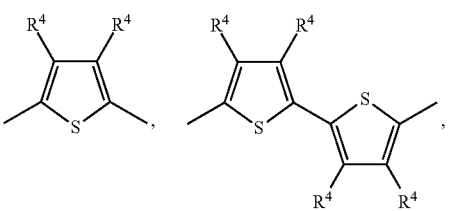

-continued

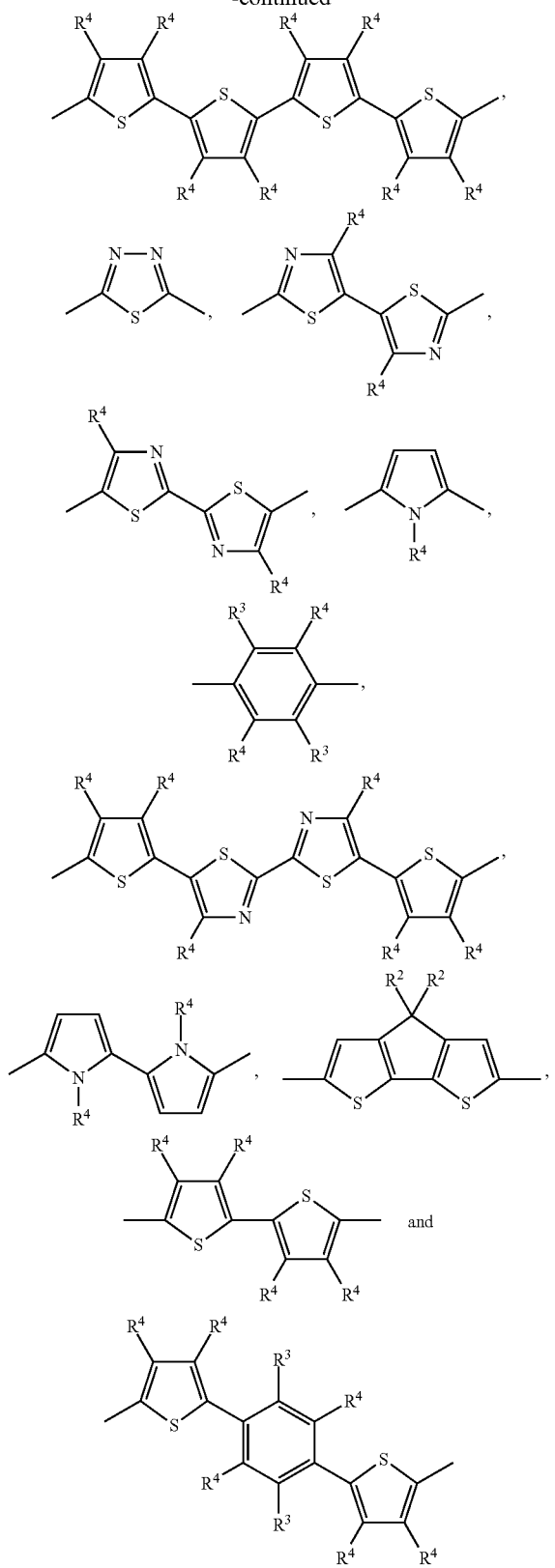

wherein R² is as defined herein, and
wherein R⁴, at each occurrence, independently is H or R³, and R³ is as defined herein.

Particularly preferred (Ar)_m and (Ar)_m' are

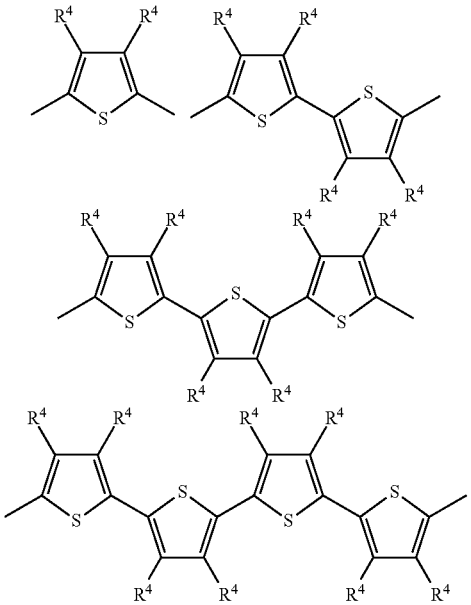

The linker Z can include one, two or more double or triple bonds and forms a conjugated system with its neighboring components. For example, Z can be a divalent vinylene group (i.e., having one double bond), a divalent ethynyl group (i.e., having one triple bond), a $C_{4-40}$ alkenyl or alkynyl group that includes two or more conjugated double or triple bonds, such as a 1,3-diene group. For example, Z can be selected from:

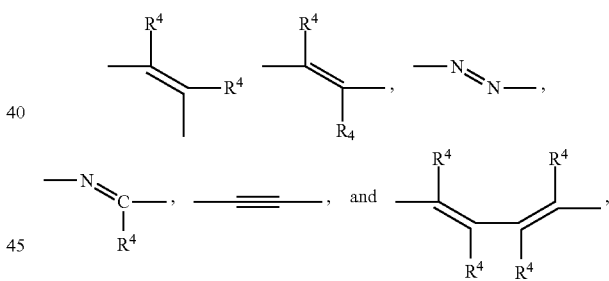

in particular

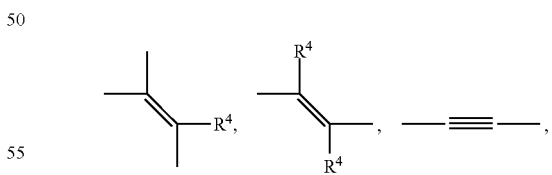

wherein R⁴ is as defined herein. In certain embodiments, Z are selected from:

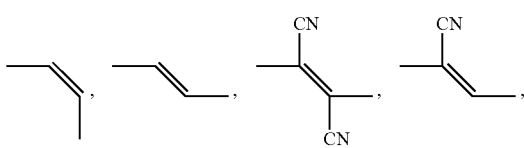

-continued
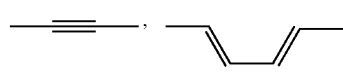
In some embodiments, $M_2$ has the formula:
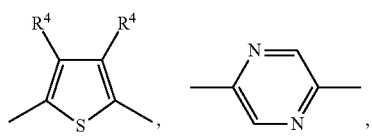
wherein m is selected from 1, 2, 3 and 4; and Ar is as defined herein. For example, $M_2$ can be selected from:
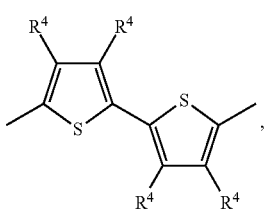
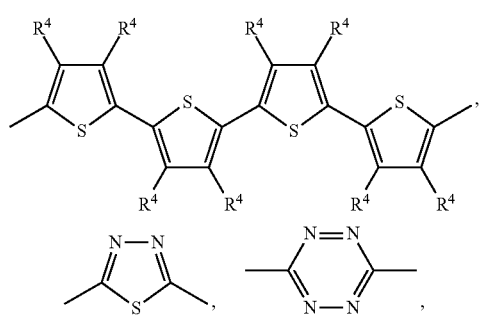
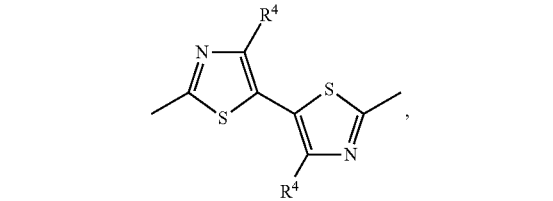
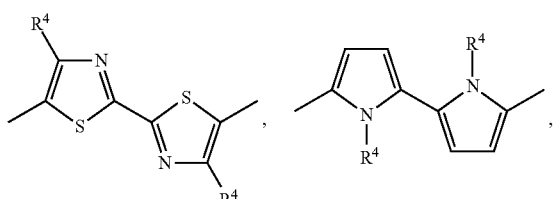
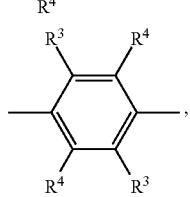
-continued
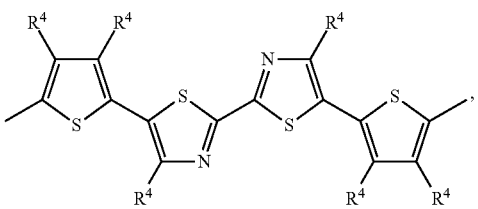
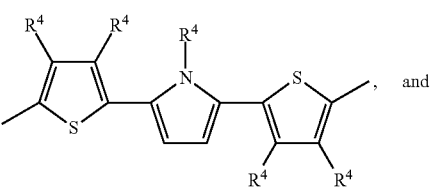, and
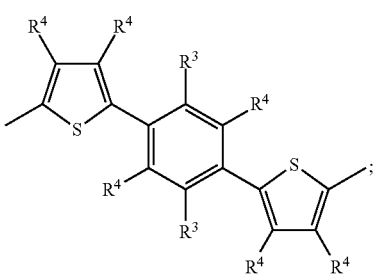
wherein $R^2$, $R^3$ and $R^4$ are as defined herein. In particular embodiments, $M_2$ can be selected from:
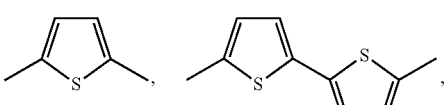
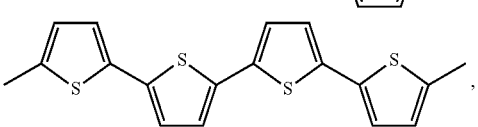
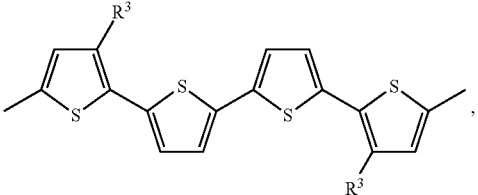
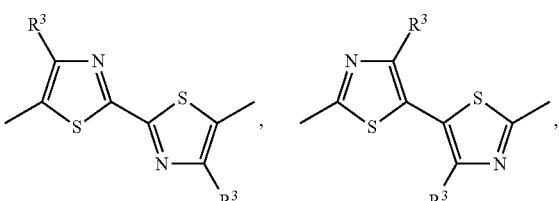
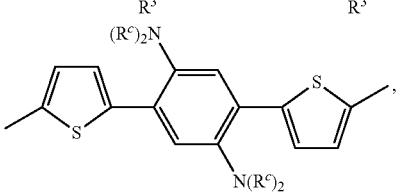

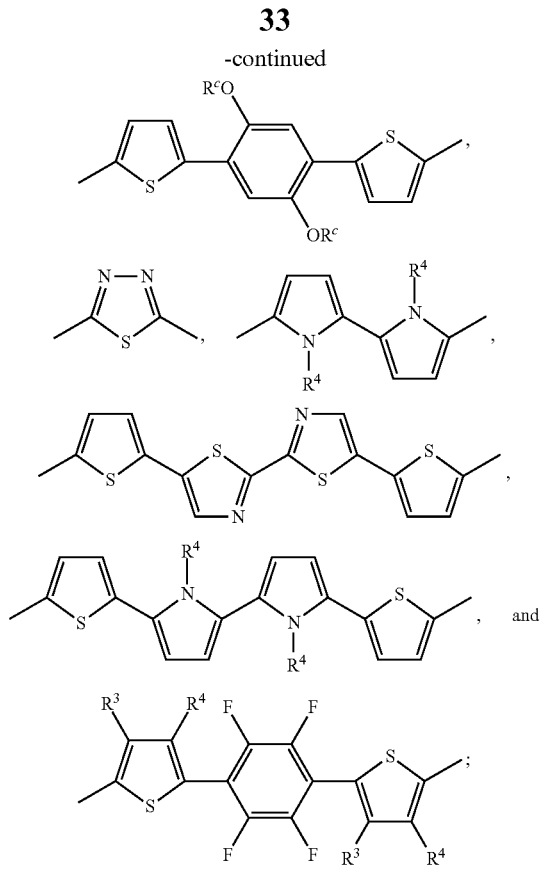

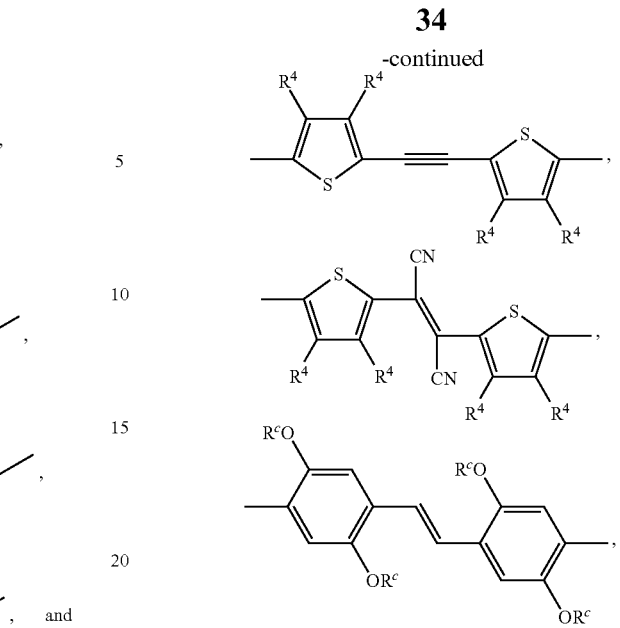

wherein $R^3$ can be independently selected from a halogen, —CN, a $C_{1-20}$ alkyl group, a $C_{1-20}$ alkoxy group, and a $C_{1-20}$ haloalkyl group; $R^4$ can be independently selected from H, a $C_{1-20}$ alkyl group, a $C_{1-20}$ alkoxy group, and a $C_{1-20}$ haloalkyl group; and $R^c$, at each occurrence, can be independently H or a $C_{1-20}$ alkyl group.

In some embodiments, $M_2$, in addition to the one or more optionally substituted monocyclic aryl or heteroaryl group, can include a linker. For example, $M_2$ can have the formula:

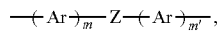

wherein m and m' are selected from 1, 2 and 4; and Ar and Z are as defined herein. In certain embodiments, $M_2$ can be selected from:

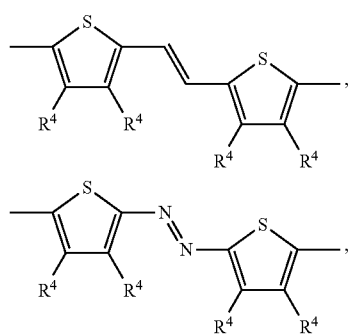

wherein $R^4$ and $R^c$ are as defined herein.

In some embodiments, $M_2$, in addition to the one or more optionally substituted monocyclic aryl or heteroaryl group, can include one or more optionally substituted polycyclic moieties. For example, $M_2$ can have the formula:

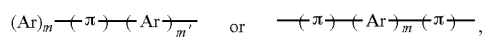

wherein m and m' are selected from 1, 2 and 4; and Ar and it are as defined herein. In certain embodiments, $M_2$ is selected from:

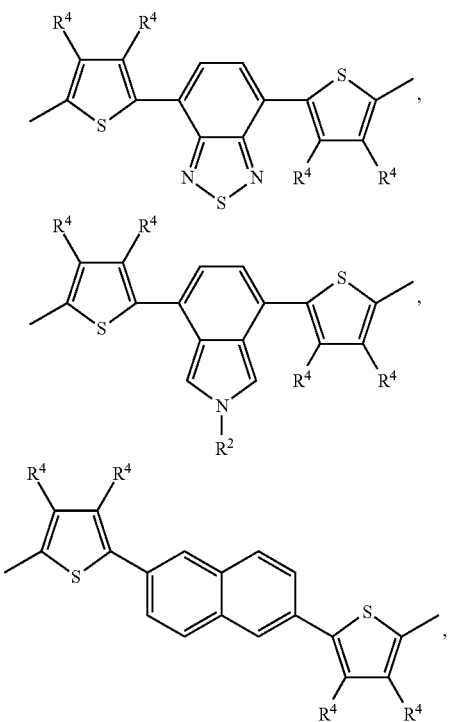

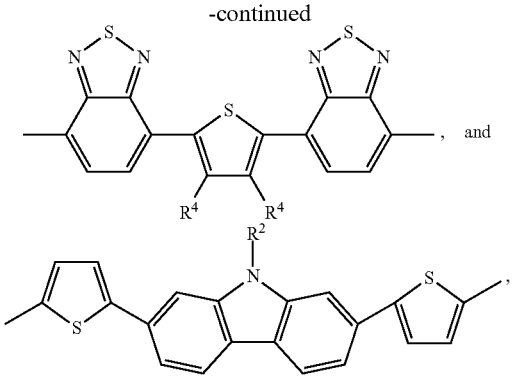

wherein $R^2$ and $R^4$ are as defined herein.

In some embodiments, $M_2$ has a formula selected from:

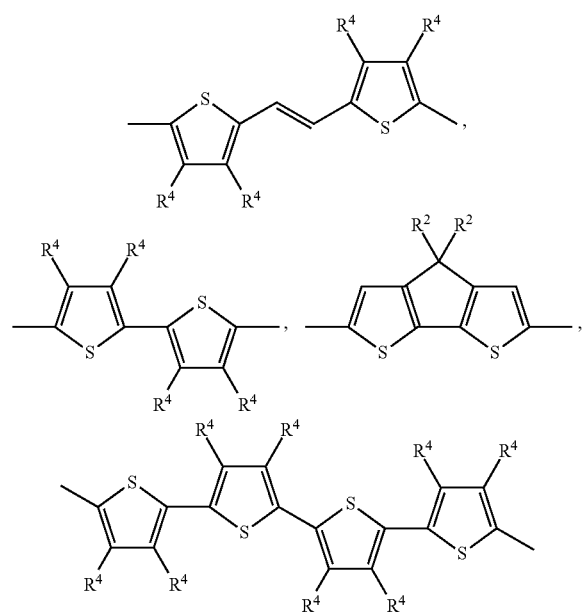

wherein:
$R^2$, $R^4$ are H or a $C_{1-20}$ alkyl group.

For the various polymers described above, n can be an integer in the range of 2 to 5,000. For example, n can be 2-1,000, 2-500, 2-400, 2-300, or 2-200. In certain embodiments, n can be 2-100. For example, n can be 8-500, 8-400, 8-300, or 8-200. In certain embodiments, n can be 8-100.

The polymers of the invention are in general stable in ambient conditions ("ambient stable") and soluble in common solvents. As used herein, a polymer can be considered electrically "ambient stable" or "stable at ambient conditions" when the charge carrier mobility or the reduction-potential of the polymer is maintained at about its initial measurement when the polymer is exposed to ambient conditions, for example, air, ambient temperature, and humidity, over a period of time. For example, a polymer according to the present invention can be described as ambient stable if its charge carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

Given their high solubilities in common solvents, the present polymers can be fabricated into various articles of manufacture using solution processing techniques in addition to other more expensive processes. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like. For example, much of the printed electronics technology has focused on inkjet printing, primarily because this technique offers greater control over feature position and multilayer registration. Inkjet printing offers the benefits of not requiring a preformed master (compared to contact printing techniques), as well as digital control of ink ejection, thereby providing drop-on-demand printing. However, contact printing techniques have the advantage of being well-suited for very fast roll-to-roll processing. Note that different printing techniques require substantially different ink rheological properties, ranging from very viscous formulations used in flexography to less viscous gravure-printing inks to far more dilute solutions suitable for inkjet printing. As such, it cannot always be assumed a priori that a polymer functioning well in spin-coated devices, hence solution-processable, will necessarily be printable.

Polymers of the present invention can be used to prepare semiconductor materials (e.g., compositions and composites), which in turn can be used to fabricate various articles of manufacture, structures, and devices. In some embodiments, semiconductor materials incorporating one or more polymers of the present teachings can exhibit p-type semiconductor activity, ambipolar activity, light absorption, and/or light emission.

The present invention, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semi-conductor material precursor, and processing (e.g., heating) the semiconductor precursor to provide a semiconductor material (e.g., a thin film semiconductor) that includes a polymer disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the polymers disclosed herein are within the scope of the present invention as are methods of making the same.

For example, articles of manufacture such as the various devices described herein can include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005)), as well as hybrid organic/inorganic dielectric materials (e.g., described in U.S. patent application Ser. No. 11/642,504). In some embodiments, the dielectric component can include the crosslinked polymer blends described in U.S. patent application Ser. Nos. 11/315,076, 60/816,952, and 60/861,308. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. The present polymers can offer processing and operation advantages in the fabrication and/or the use of these devices.

FIG. 1 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 1, an OFET can include a dielectric layer (e.g., shown as 8, 8', 8", and 8'"), a semiconductor layer (e.g., shown as 6, 6', 6", and 6'"), a gate contact (e.g., shown as 10, 10', 10", and 10'"), a substrate (e.g., shown as 12, 12', 12", and 12'"), and source and drain contacts (e.g., shown as 2, 2', 2", 2'", 4, 4', 4", and 4'").

In certain embodiments, OTFT devices can be fabricated with the present polymers on doped silicon substrates, using $SiO_2$ as the dielectric, in top-contact geometries. In particular embodiments, the active semiconductor layer which incorporates at least a polymer of the present invention can be deposited at room temperature or at an elevated temperature. In other embodiments, the active semiconductor layer which incorporates at least one polymer of the present invention can be applied by spin-coating or printing as described herein. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present invention can be applied by spin-coating or printing as described herein. Gate and source/drain contacts can be made of Au, other metals, or conducting polymers and deposited by vapor-deposition and/or printing.

Other articles of manufacture in which polymers of the present invention are useful are photovoltaics or solar cells. Polymers of the present invention can exhibit broad optical absorption and/or a tuned redox properties and bulk carrier mobilities, making them desirable for such applications. Accordingly, the polymers described herein can be used as an acceptor (n-type) semiconductor or a donor (p-type) semiconductor depending on the nature of the $M_2$ unit in a photovoltaic design, which includes an adjacent p-type or n-type semiconductor material, respectively, that forms a p-n junction. The polymers can be in the form of a thin film semiconductor, which can be deposited on a substrate to form a composite. Exploitation of polymers of the present invention in such devices is within the knowledge of a skilled artisan.

Accordingly, another aspect of the present teachings relates to methods of fabricating an organic light-emitting transistor, an organic light-emitting diode (OLED), or an organic photovoltaic device that incorporates one or more semiconductor materials of the present invention.

EXAMPLES

Example 1

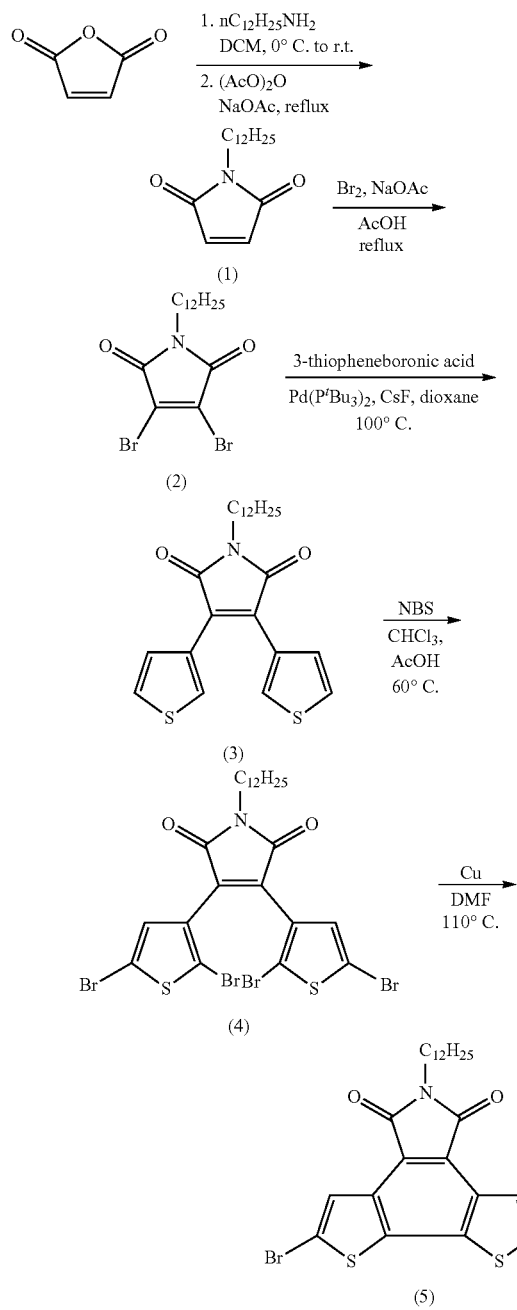

Synthesis of (1): To a suspension of maleic anhydride (11.8 g, 0.12 mol) in 30 mL of DCM at 0° C. was added slowly solution of dodecylamine (22.3 g, 0.12 mol) in 80 mL of DCM, during which more white precipitate was formed. After the addition, the reaction mixture was stirred at r.t. for another 1 h. The ppt was then filtered and dried (32.1 g). To the white solid was then added the suspension of NaOAc (3.95 g) in 75 mL of acetic anhydride. The white suspension mixture was after that refluxed for 2 h, during which clear orange solution was formed. The mixture was cooled to r.t. and poured to water. The aqeous layer was extracted with ether (2×100 mL). The ether layer was then washed with 2% KOH (2×100 mL), water and dried over $MgSO_4$. The crude was purified by column chromatography with DCM to afford compound (1) as white solid, m=16.5 g (52%). $H^1$NMR (400 MHz, $CDCl_3$): ppm 6.68 (s, 2H), 3.50 (t, 2H, J=7.0Hz), 1.57 (q, 2H, J=7.0 Hz), 1.24 (brs, 18H), 0.88 (t, 3H, 7.0 Hz) .$C^{13}$NMR (165 MHz, $CDCl_3$): ppm 170.88, 134.01, 37.94, 31.89, 29.60, 29.59, 29.53, 29.47, 29.32, 29.12, 28.53, 26.73, 22.67, 14.10.

Synthesis of (2): To a suspension of (1) (15.78 g, 0.059 mol) in 72 mL of AcOH was added NaOAc (9.75 g, 0.119 mol). The mixture was cooled to 0° C., and a solution of $Br_2$ (9.2 mL) in 14 mL of AcOH was added dropwise. The mixture was then heated at reflux for 7 h. The mixture was cooled to r.t. and poured to 100 mL of water. The aqeous layer was extracted with ethyl acetate (3×100 mL). The organic layer was then washed with 10% $Na_2SC_3$ (2×50 mL), water (3×50 mL) and dried over $MgSO_4$, then concentrated. The crude was purified by column chromatography with Hex/DCM 2:1 to afford compound (2) as white solid, m=16.78 g (66%). $H^1$NMR (400 MHz, $CDCl_3$): ppm 3.60 (t, 2H, J=7.0 Hz), 1.60 (q, 2H, J=7.0 Hz), 1.25 (brs, 18H), 0.88 (t, 3H, J=7.0 Hz) .$C^{13}$NMR (165 MHz, $CDCl_3$): ppm 163.96, 129.30, 39.84, 31.89, 29.59, 29.52, 29.41, 29.32, 29.04, 28.42, 26.61, 22.67, 14.10

Synthesis of (3): To the mixture of (2) (10 g, 23.63 mmol), 3-thiopheneboronic acid (7.56 g, 59.08 mmol), Pd(P$^t$Bu$_2$)$_3$ (0.8 g, 1.18 mmol) and CsF (26.92 g, 177 mmol) in 500 mL of 2 neck RBF was added 250 mL of dioxane. The mixture was heated at 100° C. for 24 h. The mixture was cooled down to r.t, and ¾ of dioxane was removed under reduced pressure. The residure was then poured into water, then extracted with $CHCl_3$ (3×100 mL). The organic layer was washed with brine, dried over $MgSO_4$ and concentrated. The crude was purified by column chromatography with Hex/DCM 4:1 to afford compound (3) as light yellow solid, m=7.23 g (71%). $H^1$NMR (400 MHz, $CD_2Cl_2$): ppm 7.96 (dd, 2H, $J_1$=1.2 Hz, $J_2$=3.2), 7.37 (dd, 2H, $J_1$=3.2 Hz, $J_2$=5.2 Hz), 7.24 (dd, 2H, $J_1$=1.2H, $J_2$=5.2 Hz), 3.59 (t, 2H, J=7.0 Hz), 1.64 (quin, 2H, J=7.0 Hz), 1.40-1.20 (m, 18H), 0.88 (t, 3H, J=7H). $C^{13}$NMR (165 MHz, $CDCl_3$): ppm 171.31, 129.93, 129.67, 129.57, 128.01, 126.13, 38.70, 32.29, 30.01, 29.99, 29.96, 29.88, 29.71, 29.57, 28.92, 27.21, 23.05, 14.24

Synthesis of (4): (3) (4.87 g, 11.3 mmol) was dissolved in 100 mL of $CHCl_3$ and 25 mL of AcOH, then NBS (2×8.06 g, 2×45.3 mmol) was added (2 portions for the period of 3 h). The mixture was heated at 60° C. for 18 h. Water was added to quench the reaction. The mixture was extracted with DCM (3×50 mL) and the combine organic layer was dried over $Na_2SO_4$ and concentrated. The crude was purified by column chromatography with Hex/EA (3%) to afford compound (4) as sticky dark brown liquid, which solidified when standing long time, m=5.4 g (64%). $H^1$NMR (400 MHz, $CDCl_3$): ppm 7.13 (s, 2H), 3.62 (t, 2H, J=7 Hz), 1.66 (quin, 2H, J=7 Hz), 1.40-1.20 (m, 18H), 0.88 (t, 3H, J=7 Hz). $C^{13}$NMR (165 MHz, $CDCl_3$): ppm 169.21, 131.52, 131.29, 131.25, 114.62, 112.28, 38.92, 31.90, 29.61, 29.56, 29.45, 29.33, 29.12, 28.45, 26.79, 22.67, 14.11

Synthesis of (5): To (4) (3.46 g, 4.6 mmol) and Cu (294 mg, 4.6 mmol) in 250 mL of two neck RBF was added 100 mL of DMF, the mixture was heated at 110° C. for 18 h. Another portion of Cu (74 mg) was added to the reaction mixture, and continued heating at 110° C. for 18 h. More Cu (26 mg) was then added, and continued heating for 14 h. When no starting material left, the reaction mixture was cooled down to r.t., during which dark yellow crystal formed. The crystal was filtered off, and recrystallized in DCM/Hex to afford 1.65 g of (5) as yellow solid (yield 61%). H$^1$NMR (400 MHz, CDCl$_3$): ppm 8.10 (s, 2H), 3.71 (t, 2H, J=7 Hz), 1.70 (quin, 2H, J=7 Hz), 1.40-1.20 (m, 18 Hz), 0.87 (t, 3H, J=7 Hz) .C$^{13}$NMR (165 MHz, CDCl$_3$): ppm 168.40, 139.28, 130.96, 125.08, 122.82, 118.85, 38.14, 31.90, 29.60, 29.55, 29.47, 29.33, 29.19, 28.71, 26.85, 22.67, 14.11. MS (+ve): 584 (46%), 586 (100%), 588 (56%). Anal. calcd for $C_{24}H_{27}Br_2NO_2S_2$: C 49.24, H 4.65, Br 27.30, N 2.39, S 10.95; found: C 49.04, H 4.57, Br 26.89, N 2.37, S 10.95

Example 2

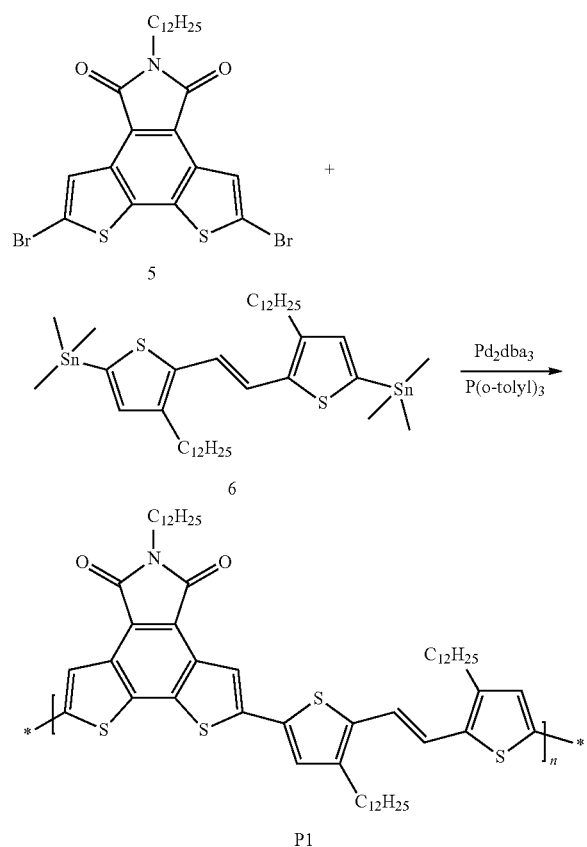

P1

Equimolar amounts of 5 (0.06 mmol, 35.1 mg) and 6 (0.06 mmol, 51.3 mg) were dissolved in anhydrous chlorobenzene (7 mL) followed by the addition of tri(dibenzylideneacetone)dipalladium(0) (0.0018 mmol, 1.6 mg) and tri(o-tolyl)phosphine (0.0036 mmol, 1.1 mg) under N$_2$. The resulting mixture was refluxed for 2 days under N$_2$. 2-bromothiophene and 2-tributylstannylthiophene were added as endcapper. After being cooled to room temperature, the reaction mixture was precipitated in methanol (300 mL) and stirred for 2 h at room temperature. The polymer P1 was filtered, washed with methanol and subjected to Soxhlet extraction for 24 h in acetone. EA (calc): % C 73.39 (73.13), % H 8.06 (8.57).

Example 3

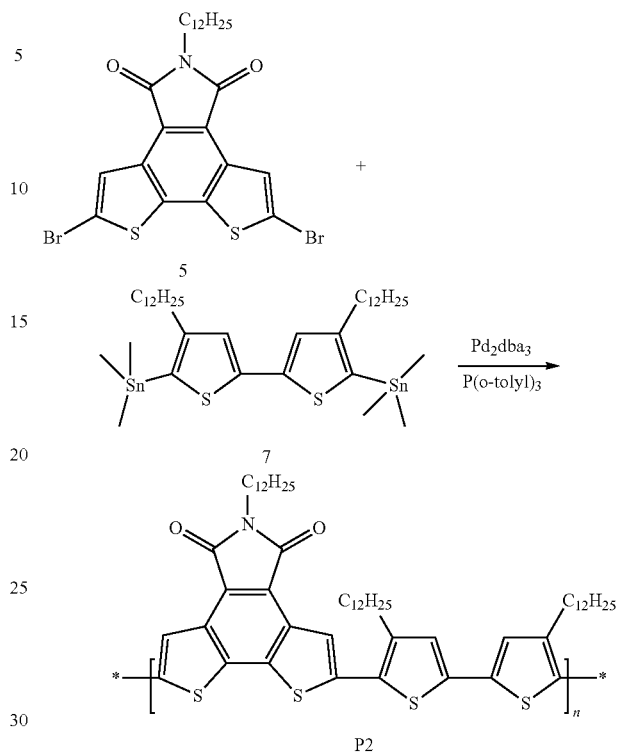

P2

Equimolar amounts of 5 (0.24 mmol, 140.5 mg) and 7 (0.24 mmol, 199 mg) were dissolved in anhydrous chlorobenzene (4.8 mL) followed by the addition of tri(dibenzylideneacetone)dipalladium(0) (0.0072 mmol, 6.6 mg) and tri(o-tolyl) phosphine (0.0144 mmol, 4.4 mg) under N$_2$. The resulting mixture was refluxed for 2 days under N$_2$. 2-bromothiophene and 2-tributylstannylthiophene were added as endcapper. After being cooled to room temperature, the reaction mixture was precipitated in methanol (300 mL) and stirred for 2 h at room temperature. The polymer P2 was filtered, washed with methanol and subjected to Soxhlet extraction for 24 h in acetone. The polymer P2 was redissolved in chlorobenzene and precipitated from methanol, filtered, washed with methanol and dried to get a brown solid (164 mg). Mn=5.3×10$^3$, Đ=5.9. $^1$H-NMR (1,1,2,2-Tetrachloroethane-d$_2$) (400 MHz) ppm 8.13 (m, 2H) ppm 7.15 (m, 2H) ppm 3.79 (m, 2H) ppm 2.97 (m, 4H) ppm 1.84 (m, 6H) 1.41 (broad peak, 54H) ppm 0.94 (m, 9H) ppm.

Example 4

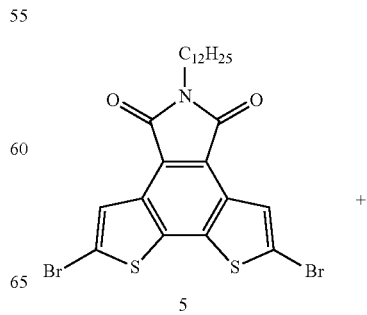

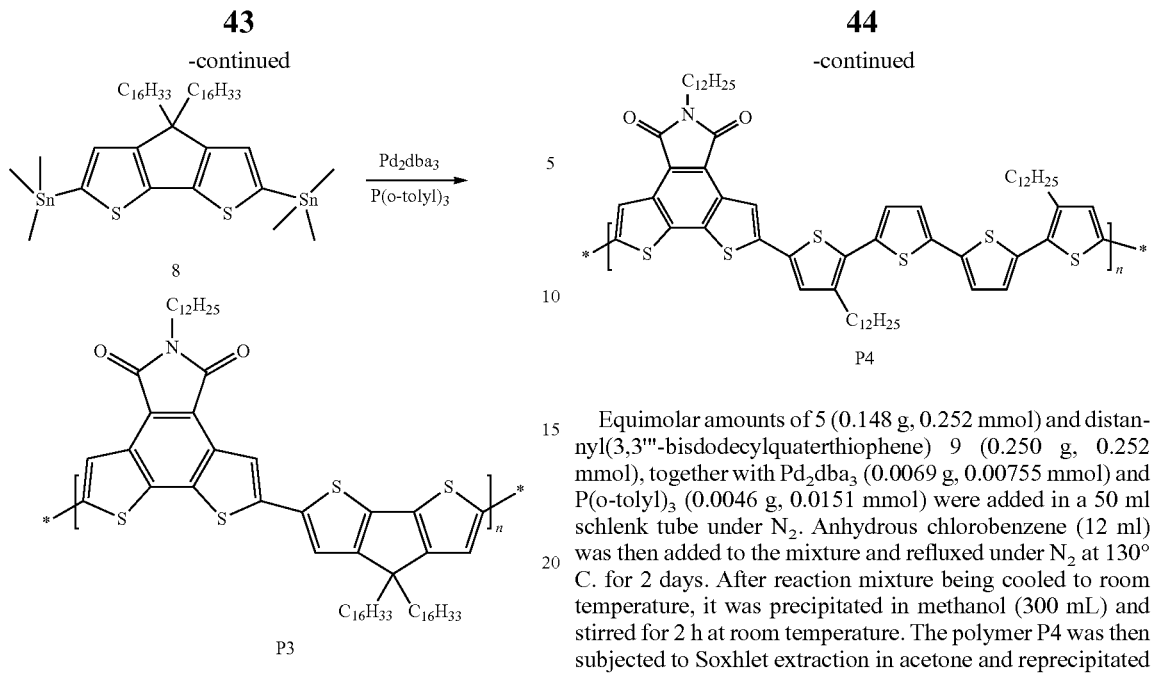

Equimolar amounts of 5 (0.0922 g, 0.157 mmol) and distannylcyclopentadithiophene 8 (0.150 g, 0.157 mmol), together with Pd$_2$dba$_3$ (0.00431 g, 0.00471 mmol) and P(o-tolyl)$_3$ (0.00287 g, 0.00942 mmol) were added in a 50 ml schlenk tube under N$_2$. Anhydrous chlorobenzene (5.2 ml) was then added to the mixture and refluxed under N$_2$ at 130° C. for 2 days. 2-bromothiophene and 2-tributylstannylthiophene were added as endcapper. After reaction mixture being cooled to room temperature, it was precipitated in methanol (300 mL) and stirred for 2 h at room temperature. The polymer P3 was then subjected to Soxhlet extraction in acetone and reprecipitated in methanol. Yield: 0.115 g dark solid (70%) Mn: 1.04×10$^4$ g/mol, Đ: 2.65 Elemental analysis (calcd): C, 73.93 (74.15); H, 8.70 (9.04); N, 1.28 (1.30).

Device result (see Example 6): 1.4×10$^{-3}$ cm$^2$V$^{-1}$s$^{-1}$ (BGBC, 200° C.)

Example 5

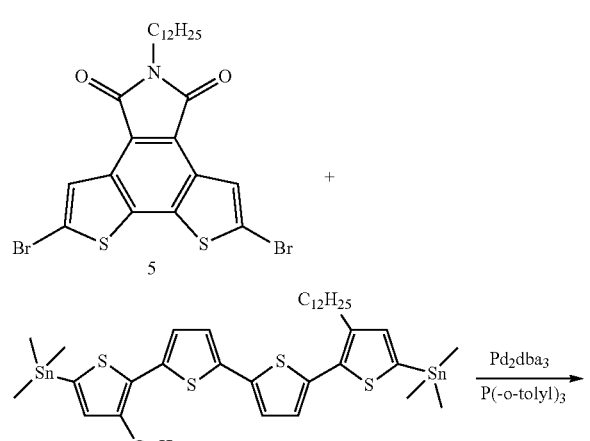

Equimolar amounts of 5 (0.148 g, 0.252 mmol) and distannyl(3,3'''-bisdodecylquaterthiophene) 9 (0.250 g, 0.252 mmol), together with Pd$_2$dba$_3$ (0.0069 g, 0.00755 mmol) and P(o-tolyl)$_3$ (0.0046 g, 0.0151 mmol) were added in a 50 ml schlenk tube under N$_2$. Anhydrous chlorobenzene (12 ml) was then added to the mixture and refluxed under N$_2$ at 130° C. for 2 days. After reaction mixture being cooled to room temperature, it was precipitated in methanol (300 mL) and stirred for 2 h at room temperature. The polymer P4 was then subjected to Soxhlet extraction in acetone and reprecipitated in methanol. Yield: 0.136 g dark solid (49%) Mn: 1.03×10$^4$ g/mol, Đ: 1.61

Example 6

Fabrication of Bottom-Gate Bottom-Contact Transistors Based on P3

Bottom-gate bottom-contact (BGBC) TFTs were fabricated on Si/SiO$_2$ [200 nm SiO$_2$] substrates with lithographically patterned gold source and drain electrodes. Channel length and width are 5 µm and 350 µm, respectively, that give W/L=70. These substrates were HMDS treated. Semiconductor layer was deposited by spin coating from the semiconductor solution (30 mg/ml dissolved in dichlorobenzene) at 2000 rpm for 1 minute. The devices were further annealed in inert condition at 200° C. for 30 minutes before measurement at ambient condition.

Device result: Mobility (polymer P3)=1.4×10$^{-3}$ cm$^2$V$^{-1}$s$^{-1}$ (BGBC, 200° C.)

The invention claimed is:
1. A polymer of the formula:

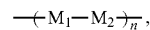

wherein:
M$_1$ is an optionally substituted dithienophthalimide:

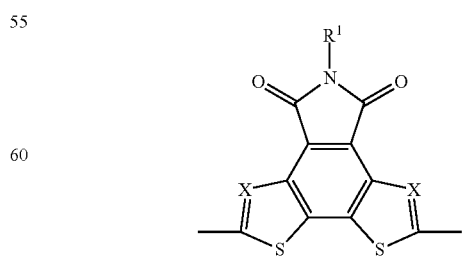

wherein:
X is N or C—R, wherein R is H or a $C_1$-$C_{40}$ alkyl group, $R^1$, at each occurrence, is independently selected from H, a $C_{1-40}$ alkyl group, a $C_{2-40}$ alkenyl group, a $C_{1-40}$ haloalkyl group, and a monocyclic or polycyclic moiety, wherein:

each of the $C_{1-40}$ alkyl group, the $C_{2-40}$ alkenyl group, and the $C_{1-40}$ haloalkyl group can be optionally substituted with 1-10 substituents independently selected from a halogen, —CN, —NO$_2$, OH, —NH$_2$, —NH($C_{1-20}$ alkyl), —N($C_{1-20}$ alkyl)$_2$, —S(O)$_2$OH, —CHO, —C(O)-$C_{1-20}$ alkyl, —C(O)OH, —C(O)—O$C_{1-20}$ alkyl, —C(O)NH$_2$, —C(O)NH—$C_{1-20}$ alkyl, —C(O)N($C_{1-20}$ alkyl)$_2$, —O$C_{1-20}$ alkyl, —SiH$_3$, —SiH($C_{1-20}$ alkyl)$_2$, SiH$_2$($C_{1-20}$ alkyl), and —Si($C_{1-20}$ alkyl)$_3$;

and the monocyclic or polycyclic moiety is optionally covalently bonded to the imide nitrogen via an optional linker, and is optionally substituted with 1-5 substituents independently selected from a halogen, oxo, —CN, —NO$_2$, OH, =C(CN)$_2$, —NH$_2$, —NH($C_{1-20}$ alkyl), —N($C_{1-20}$ alkyl)$_2$, —S(O)$_2$OH, —CHO, —C(O)OH, —C(O)—$C_{1-20}$ alkyl, —C(O)—O$C_{1-20}$ alkyl, —C(O)NH$_2$, —C(O)NH—$C_{1-20}$ alkyl, —C(O)N($C_{1-20}$ alkyl)$_2$, —SiH$_3$, SiH($C_{1-20}$ alkyl)$_2$, —SiH$_2$($C_{1-20}$ alkyl), —Si($C_{1-20}$ alkyl)$_3$, —O—$C_{1-20}$ alkyl, —O—$C_{1-20}$ alkenyl, —O—$C_{1-20}$ haloalkyl, $C_{1-20}$ alkyl, $C_{1-20}$ alkenyl, $C_{1-20}$ haloalkyl, $C_{7-20}$ arylalkyl, $C_{6-20}$ aryloxy and $C_{7-20}$ arylcarbonyl, wherein $M_2$, is selected from:

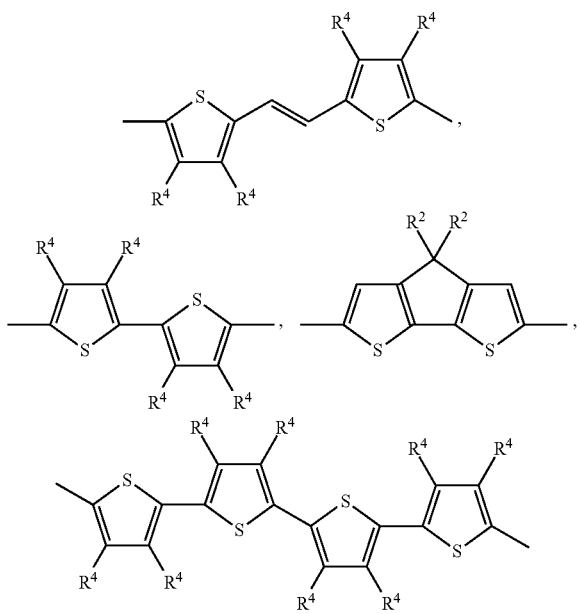

wherein:

$R^2$, $R^4$ is H or a $C_{1-20}$ alkyl group; and n is an integer between 2 and 5000.

2. The polymer of claim 1, wherein:

$R^1$ is selected from H, a $C_{1-40}$ alkyl group, a $C_{2-40}$ alkenyl group, a $C_{2-40}$ alkynyl group, a $C_{1-40}$ haloalkyl group, -L-Ar$^1$—Ar$^1$, -L-Cy$^1$, -L-Cy$^1$-Cy$^1$, wherein:

L, at each occurrence, is independently selected from —Y—O—Y—, —Y—C(O)—Y—, a divalent $C_{1-20}$ alkyl group, a divalent $C_{1-20}$ alkenyl group, a divalent $C_{1-20}$ haloalkyl group, and a covalent bond;

Ar$^1$, at each occurrence, is independently a monovalent or divalent $C_{6-14}$ aryl group or a 5-14 membered heteroaryl group, each optionally substituted with 1-5 substituents independently selected from a halogen, —CN, a $C_{1-6}$ alkyl group, a $C_{1-6}$ alkoxy group, and a $C_{1-6}$ haloalkyl group;

Cy$^1$, at each occurrence, is independently a monovalent or divalent $C_{5-14}$ cycloalkyl group or a 5-14 membered cycloheteroalkyl group, each optionally substituted with 1-5 substituents independently selected from a halogen, —CN, a $C_{1-6}$ alkyl group, a $C_{1-6}$ alkoxy group, and a $C_{1-6}$ haloalkyl group;

Y, at each occurrence, is independently selected from a divalent $C_{1-6}$ alkyl group, a divalent $C_{1-6}$ haloalkyl group, and a covalent bond.

3. The polymer of claim 1, wherein n is an integer between 4 and 1000.

4. An article of manufacture selected from the group consisting of an electronic device, an optical device, and an optoelectronic device, comprising one or more polymers of claim 1.

5. The article of manufacture of claim 4, wherein the article of manufacture is a thin film semiconductor comprising the one or more polymers.

6. The article of manufacture of claim 4, wherein the article of manufacture is a field effect transistor device comprising a thin film semiconductor comprising the one or more polymers.

7. The article of manufacture of claim 4, wherein the article of manufacture is a photovoltaic device comprising a thin film semiconductor comprising the one or more polymers.

8. The article of manufacture of claim 4, wherein the article of manufacture is an organic light emitting device comprising a thin film semiconductor comprising the one or more polymers.

* * * * *